US006673510B1

(12) United States Patent
Nakamura et al.

(10) Patent No.: US 6,673,510 B1
(45) Date of Patent: Jan. 6, 2004

(54) PHOTOSENSITIVE COMPOSITION AND PLANOGRAPHIC PRINTING PLATE USING THE SAME

(75) Inventors: Ippei Nakamura, Shizuoka-ken (JP); Hiromichi Kurita, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 97 days.

(21) Appl. No.: 09/691,258

(22) Filed: Oct. 19, 2000

(30) Foreign Application Priority Data

Oct. 19, 1999 (JP) .......................................... 11-296715
Dec. 16, 1999 (JP) .......................................... 11-357048

(51) Int. Cl.$^{7}$ ............................................... G03F 7/039
(52) U.S. Cl. ..................... 430/270.1; 430/964; 101/453
(58) Field of Search ............................. 430/270.1, 302, 430/348, 944, 945, 964; 101/130, 453, 463.1

(56) References Cited

U.S. PATENT DOCUMENTS

| | | | | | |
|---|---|---|---|---|---|
| 4,756,993 | A | * | 7/1988 | Kitatani et al. | 430/69 |
| 5,576,443 | A | * | 11/1996 | Fabricius et al. | |
| 5,989,772 | A | * | 11/1999 | Tutt et al. | 430/201 |
| 6,072,059 | A | * | 6/2000 | Harada et al. | 548/455 |
| 6,083,663 | A | * | 7/2000 | Vermeersch et al. | 430/302 |
| 6,106,996 | A | * | 8/2000 | Van Damme et al. | 430/271.1 |
| 6,153,353 | A | * | 11/2000 | Van Damme et al. | 430/270.1 |
| 6,159,657 | A | * | 12/2000 | Fleming et al. | 430/270.1 |
| 6,342,336 | B2 | * | 1/2002 | Verschueren et al. | 430/271.1 |
| 6,391,517 | B1 | * | 5/2002 | Verschueren et al. | 430/270.1 |
| 6,447,977 | B2 | * | 9/2002 | Vermeersch et al. | 430/270.1 |
| 6,472,119 | B1 | * | 10/2002 | Verschueren et al. | 430/270.1 |
| 2002/0015911 | A1 | * | 2/2002 | Nakamura | 430/270.1 |

FOREIGN PATENT DOCUMENTS

| | | | | | |
|---|---|---|---|---|---|
| EP | 0 841 189 | A1 | * | 5/1998 | |
| EP | 841 189 | A1 | * | 5/1998 | B41M/5/40 |
| EP | 0 854 382 | A1 | * | 7/1998 | |
| EP | 0901902 | | | 3/1999 | |
| EP | 0909657 | | | 4/1999 | |
| JP | 08-245902 | A | * | 9/1996 | |
| JP | 10-114151 | A | * | 5/1998 | |
| JP | 10-123659 | A | * | 5/1998 | |
| JP | 10-123660 | A | * | 5/1998 | |
| JP | 2001-142202 | A | * | 5/2001 | |
| JP | 2001-209172 | A | * | 8/2001 | |
| WO | WO-01/14931 | A1 | * | 3/2001 | |

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

The present invention provides a photosensitive composition comprising an infrared absorbing agent represented by the following formula (I) and a polymer compound which is insoluble in water and soluble in an aqueous alkali solution and becoming soluble in an aqueous alkali solution by radiation of an infrared laser. In the formula described below, $R^1$ and $R^2$ independently represent an alkyl group having 1 to 18 carbon atoms or an alkyl group having 9 to 30 carbon atoms and Z represents a heptamethine group which may have a substituent. The definitions of other substituents are shown in the specification. According to the present invention, a photosensitive composition having high development latitude and storage stability, together with a positive type planographic printing plate for direct plate-making which can form an image with high sensitivity by using an infrared laser, are provided.

(I)

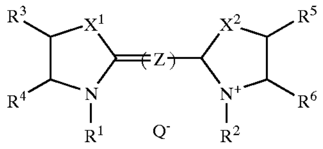

11 Claims, No Drawings

PHOTOSENSITIVE COMPOSITION AND PLANOGRAPHIC PRINTING PLATE USING THE SAME

BACKGROUND OF THE INVENTION

1. Field of Invention

The present invention relates to a photosensitive composition suitable as a positive type image recording material and to a planographic printing plate using the photosensitive composition, and, particularly, to a photosensitive composition and a planographic printing plate using the same, the photosensitive composition being capable of forming a positive type image by using an infrared laser, the composition being suitable for a planographic printing plate for the so-called direct plate-making which enables writing by the heat of an infrared laser, thermal head or the like and can be directly performed based on digital signals from a computer or the like.

2. Description of the Related Art

Along with recent development of a solid laser and semiconductor laser emitting light within a range from the near infrared region to the infrared region, a system of effecting plate-making directly from digital data of a computer using these infrared lasers has been remarked.

A positive type planographic printing plate (material) for direct plate-making using an infrared laser is disclosed in Japanese Patent Application Laid-Open (JP-A) No. 7-285275. This invention relates to an image recording material obtained by adding a material which absorbs light to generate heat and a positive type photosensitive compound such as a quinone diazide compound to a resin which is soluble in an aqueous alkali solution. The positive photosensitive compound functions as an dissolution-preventing agent, which substantially decreases the solubility of the resin soluble in an aqueous alkali solution, in an image portion. In a non-image portion, on the other hand, the photosensitive compound is decomposed by heat so that it does not develop dissolution-preventing ability, and can eventually be removed by development to thereby form an image.

It has been found as a result of the studies made by the inventors of the present invention that a positive image can be obtained even if these quinone azide compounds are not added to the image recording material. However, an image recording material from which these quinone azide compounds are simply excluded has the drawback that the stability of sensitivity to the density of a developer, namely, development latitude is impaired resultantly.

Meanwhile, onium salts and compounds which are insoluble in an alkali and can have hydrogen-hydrogen bonding are known to have a significant effect of preventing an alkali-soluble polymer from dissolving in an alkali. As an image recording material which is adapted to an infrared laser, compositions using a cationic infrared ray absorbing dye as an agent suppressing the dissolution of an aqueous alkali-solution-soluble polymer exhibit a positive effect as described in WO97/39894. This positive effect represents the effect of forming an image by making a polymer film of the layser-irradiated part lose the dissolution-suppressing ability, by making use of the heat generated when an infrared ray absorbing dye absorbs laser light.

Its image recording properties is sufficient on the surface of a photosensitive material irradiated with the laser. However, only insufficient image recording properties is obtained in the deep portion of the photosensitive material due to thermal diffusion. Therefore, it is hard to provide ON-OFF of exposed portions/unexposed portions in concerning alkali developing, posing the problem that a good image is not obtained (i.e., low sensitivity, narrow development latitude). The development latitude mentioned here indicates an allowable range in which a good image can be formed when the alkali concentration of an alkali developer is changed.

SUMMARY OF THE INVENTION

Accordingly an object of the present invention is to provide a photosensitive composition which has a wide development latitude and high image recording properties and exhibits a high storage stability (that is, its image recording properties is not lowered even if it is stored for a long period of time) and to also provide a positive type planographic printing plate using the photosensitive composition, the printing plate being capable of forming an image by using an infrared laser used for direct plate-making.

The inventors of the present invention have made earnest studies for the purpose of increasing image recording properties, namely, development latitude and improving storage stability and as a result, found that both of the development latitude and the storage stability are improved by using a specific infrared absorbing agent. The present invention was completed on the basis of this discovery.

According to a first aspect of the present invention, there is provided a photosensitive composition comprising an infrared absorbing agent (a) represented by the following formula (I) and a polymer compound (b) which is insoluble in water and soluble in an aqueous alkali solution wherein the solubility of the photosensitive composition in an aqueous alkali solution is changed by radiation of an infrared laser.

(I)

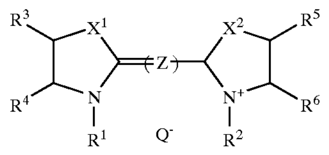

wherein $X^1$ and $X^2$ independently represent —$CR^7R^8$—, —S—, —Se—, —$NR^9$—, —CH=CH— or —O—, $R^1$ and $R^2$ independently represent an alkyl group having 9 to 30 carbon atoms, $R^3$, $R^4$, $R^5$ and $R^6$ independently represent a hydrogen atom or an alkyl group having 1 to 10 carbon atoms and may represent a plurality of atoms required for $R^3$ and $R^4$ or $R^5$ and $R^6$ to be combined with each other to form an aliphatic 5- or 6-membered ring, an aromatic 6-membered ring, an aromatic 10-membered ring, a substituted aromatic 6-membered ring or a substituted aromatic 10-membered ring, $R^7$ and $R^8$ independently represent an alkyl group having 1 to 18 carbon atoms or an aryl group having 6 to 18 carbon atoms, $R^9$ represents an alkyl group having 1 to 18 carbon atoms or an aryl group having 6 to 18 carbon atoms, Z represents a heptamethine group which may have a substituent wherein the substituent may be an alkyl group having 8 or less carbon atoms, a halogen atom or an amino group or the heptamethine group may include a cyclohexene ring or a cyclopentene ring which may have a substituent formed by combining substituents on two methine carbons with each other where the substituent on the ring structure is selected from an alkyl group having 6 or less carbon atoms or a halogen atom and Q represents a counter ion.

According to a second aspect of the present invention, there is provided a photosensitive composition comprising an infrared absorbing agent (c) represented by the following formula (II) and a polymer compound (b) which is insoluble in water and soluble in an aqueous alkali solution wherein the solubility of the photosensitive composition in an aqueous alkali solution is changed by radiation of an infrared laser.

(II)

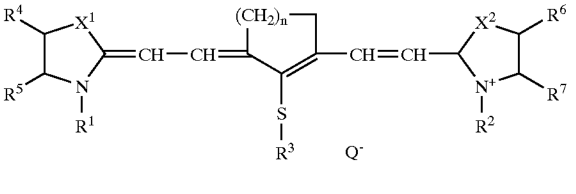

wherein $X^1$ and $X^2$ independently represent —$CR^8R^9$—, —S—, —Se—, —$NR^{10}$—, —CH═CH— or —O—, n denotes an integer of 2, 3 or 4, $R^1$ and $R^2$ independently represent an alkyl group having 1 to 18 carbon atoms or a substituted alkyl group having 1 to 18 carbon atoms, $R^3$ represents a group selected from the group consisting of an alkyl group having 1 to 10 carbon atoms, a substituted alkyl group having 1 to 10 carbon atoms, an aryl group, a substituted aryl group and a heterocyclic group having 5 to 6 carbon atoms in the ring, $R^4$, $R^5$, $R^6$ and $R^7$ independently represent a hydrogen atom, an alkyl group having 1 to 10 carbon atoms or a substituted alkyl group having 1 to 10 carbon atoms and may represent a plurality of atoms required for $R^4$ and $R^5$ or $R^6$ and $R^7$ to be combined with each other to form an aliphatic 5- or 6-membered ring, an aromatic 6-membered ring, an aromatic 10-membered ring, a substituted aromatic 6-membered ring or a substituted aromatic 10-membered ring, $R^8$ and $R^9$ independently represent an alkyl group having 1 to 18 carbon atoms, a substituted alkyl group having 1 to 18 carbon atoms, an aryl group having 6 to 18 carbon atoms or a substituted aryl group having 6 to 18 carbon atoms, $R^{10}$ represents an alkyl group having 1 to 18 carbon atoms, a substituted alkyl group having 1 to 18 carbon atoms, an aryl group having 6 to 18 carbon atoms or a substituted aryl group having 6 to 18 carbon atoms and Q represents a counter ion having a molecular weight of 70 or more.

According to a third aspect of the present invention, the counter ion Q of the infrared absorbing agent represented by the formula (I) or (II) is preferably a counter ion represented by the following formula (III) or containing a sulfonic acid structure.

(III)

$$[A—(Y)_m]^{\ominus}$$

wherein A represents an atom selected from the group consisting of B, P, As, Sb, Cl and Br, Y represents a halogen atom or an oxygen atom and m denotes an integer from 1 to 6.

The action of each of the above inventions are not clear, however, as to the invention according to the first aspect, a long chain alkyl group is introduced at the N position of a dye in the infrared absorbing agent (a) represented by the formula (I), whereby the organicity of the dye is improved and efficient conversion from light to heat on the surface of the photosensitive layer is carried out. Also, the presence of the infrared absorbing agent having a long chain alkyl group improves the stability in storage. Consequently, the infrared absorbing agent (a) is improved in the affinity to the aqueous alkali(solution)-soluble polymer (b) and in the ability of suppressing the dissolution of the aqueous alkali-soluble polymer (b). It is considered that, due to such reasons, an improvement in image recording properties and a suppression effect of the deterioration of image recording properties after long term storage can be effected.

As to the invention according to the second aspect, a —S—interconnecting substituent is introduced on the methine chain of the dye in the infrared absorbing agent (c) represented by the formula (II), whereby the organicity of the dye is improved. Consequently, the infrared absorbing agent (c) is improved in the affinity to the aqueous alkali-soluble polymer (b) and in the ability of suppressing the dissolution of the aqueous alkali-soluble polymer (b). It is therefore considered that, due to such reasons, an improvement in image recording properties and a suppression effect of the deterioration of image recording properties after long term storage can be effected.

In the infrared absorbing agent (c) used in the invention according to the second aspect, a counter anion Q having a molecular weight of 70 or more is used. When the molecular weight of the counter ion is small, an acid derived from a counter anion produced by the decomposition of the dye is volatized, which tends to cause such disadvantages that the infrared absorbing agent becomes unstable, the organicity of the whole infrared absorbing agent is decreased and hence the affinity of the infrared absorbing agent to the aqueous alkali-soluble polymer (b) is decreased, resulting in that the dye tends to coagulate. However, when a counter anion having a molecular weight of 70 or more is used in the same manner as in the present invention, the organicity of the dye can be made high and further the stability of the infrared absorbing agent is improved. It is therefore considered that the deterioration of image recording properties after long term storage can be suppressed.

According to a fourth aspect of the present invention, there is provided a planographic printing plate comprising a photosensitive layer consisting of the aforementioned photosensitive composition, the photosensitive layer being disposed on a substrate.

DESCRIPTION OF THE PREFERRED EMBODIMENTS

First Embodiment

The first embodiment of the present invention will be described in detail below. [Infrared absorbing agent (a) represented by the general formula (I)]

In the infrared absorbing agent (c) used in the invention according to the second aspect, a counter anion Q having a molecular weight of 70 or more is used. When the molecular weight of the counter ion is small, an acid derived from a counter anion produced by the decomposition of the dye is volatilized, which tends to cause such disadvantages that the infrared absorbing agent becomes unstable, the organicity of the whole infrared absorbing agent is decreased and hence the affinity of the infrared absorbing agent to the aqueous alkali-soluble polymer (b) is decreased, resulting in that the dye tends to coagulate. However, when a counter anion having a molecular weight of 70 or more is used in the same manner as in the present invention, the organicity of the dye can be made high and further the stability of the infrared absorbing agent is improved. It is therefore considered that the deterioration of image recording properties after long term storage can be suppressed.

The above mentioned infrared absorbing agent represented by the general formula (I) will be described further in detail.

In the general formula (I), each of $X^1$ and $X^2$ independently represents —$CR^7R^8$—, —S—, —Se—, —$NR^9$—, —CH═CH— or —O—. Wherein, $R^7$ and $R^8$ represent an alkyl group having 1 to 18 carbon atoms, a substituted alkyl group having 1 to 18 carbon atoms, an aryl group having 6 to 18 carbon atoms, or a substituted aryl group having 6 to 18 carbon atoms.

Each of $R^1$ and $R^2$ independently represents an alkyl group having 9 to 30 carbon atoms, and these alkyl groups may have a substituent.

Each of $R^3$, $R^4$, $R^5$ and $R^6$ independently represents a hydrogen atom, an alkyl group having 1 to 10 carbon atoms or a substituted alkyl group having 1 to 10 carbon atoms, $R^3$ and $R^4$ or $R^5$ and $R^6$ may be bonded together and represent a plurality of atoms necessary for forming an aliphatic 5-membered or 6-membered ring, aromatic 6-membered ring, aromatic 10-membered ring, substituted aromatic 6-membered ring or substituted aromatic 10-membered ring. $R^9$ represents an alkyl group having 1 to 18 carbon atoms, a substituted alkyl group having 1 to 18 carbon atoms, an aryl group having 6 to 18 carbon atoms, or a substituted aryl group having 6 to 18 carbon atoms.

The above-mentioned alkyl group represented by $R^1$ to $R^9$ includes straight chain, branched or cyclic alkyl groups having 9 to 30, or 1 to 18 carbon atoms. Specific examples thereof include a methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group and 2-norbornyl group. Among them, it is more preferable that $R^1$ and $R^2$ represent a straight chain alkyl group, $R^3$ to $R^9$ represent a straight chain alkyl group having 1 to 10 carbon atoms, a branched alkyl group having 3 to 12 carbon atoms or a cyclic alkyl group having 5 to 10 carbon atoms.

When these alkyl groups have a substituent, monovalent non-metal atoms excepting hydrogen are used as the substituent. Preferable examples thereof include halogen atoms (—F, —Br, —Cl, —I), hydroxyl group, alkoxy groups, aryloxy groups, mercapto group, alkylthio groups, arylthio groups, alkyldithio groups, aryldithio groups, amino group, N-alkylamino groups, N,N-dialkylaminogroups, N-arylaminogroup, N,N-diarylaminogroups, N-alkyl-N-arylaminogroups, acyloxygroups, carbamoyloxygroup, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acylthio group, acylamino groups, N-alkylacylamino groups, N-arylacylamino groups, ureido group, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N'-aryl-N-arylureido groups, N',N'-diaryl-N-alkylureido groups, N',N'-diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alkoxycarbonylamino groups, N-aryl-N-aryloxycarbonylamino groups, formyl group, acyl groups, carboxyl group and conjugated base group (hereinafter, referred to as "carboxylate"), alkoxycarbonyl groups, aryloxycarbonyl groups, carbamoyl groups, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl group, arylsulfonyl groups, sulfo group (—$SO_3H$) and conjugated base thereof (hereinafter, referred to as "sulfonato group"), alkoxysulofnyl groups, aryloxysulfonyl groups, sulfinamoyl group, N-alkylsulfinamoyl groups, N,N-dialkylsulfinamoyl groups, N-arylsulfinamoyl groups, N,N-diarylsulfinamoyl groups, N-alkyl-N-arylsulfinamoyl groups, sulfamoyl group, N-alkylsulfamonyl groups, N,N-dialkylsulfamoyl groups, N-arylsulfamoyl groups, N,N-diarylsulfamoyl groups, N-alkyl-N-arylsulfamoyl groups, N-acylsulfarnoyl group and conjugated base group, N-alkylsulfonylsulfamoyl groups (—$SO_2NHSO_2R$, R represents an alkyl group) and conjugated base group thereof, N-arylsulfonylsulfamoyl groups (—$SO_2NHSO_2Ar$, Ar represents a aryl group) and conjugated base group thereof, N-alkylsulfonylcarbamoyl groups (—$CONHSO_2R$, R represents an alkyl group) and conjugated base group thereof, N-arylsulfonylcarbamoyl groups (—$CONHSO_2Ar$, Ar represents an aryl group) and conjugated base group thereof, alkoxysilyl groups (—SI$(OR)_3$, R represents an alkyl group), aryloxysilyl groups (—SI$(OAr)_3$, Ar represents an aryl group), hydroxysilyl group (—Si(OH)3) and conjugated base group thereof, phosphono group (—$PO_3H_2$) and conjugated base group thereof (hereinafter, referred to as "phosphonato group"), dialkylphosphono group (—$PO_3R^2$, R represents an alkyl group), diarylphosphono group (—$PO_3Ar_2$, Ar represents an aryl group), alkylarylphosphono group (—$PO_3$(R)(Ar), R represents an alkyl group and Ar represents an aryl group), monoalkylphosphono group (—PO3H(R), R represents an alkyl group) and conjugated base group thereof (hereinafter, referred to as "alkylphosphonato group"), monoarylphosphono group (—$PO_3H$(Ar), Ar represents an aryl group) and conjugated base group thereof (hereinafter, referred to as "arylphosphonato group"), phosphonooxy group (—$OPO_3H_2$) and conjugated base group thereof (hereinafter, referred to as "phosphonatooxy group"), dialkylphosphonooxy group (—$OPO_3(R)_2$ R represents an alkyl group), diarylphosphonooxy group (—$OPO_3(Ar)_2$ Ar represents an aryl group), alkylarylphosphonooxy group (—$OPO_3$(R)(Ar), R represents an alkyl group and Ar represents an aryl group), monoalkylphosphonooxy group (—$OPO_3H$(R), R represents an alkyl group) and conjugated base group thereof (hereinafter, referred to as "alkylphosphonatooxy group"), monoarylphosphonooxy group (—$OPO_3H$(Ar), Ar represents an aryl group) and conjugated base group thereof (hereinafter, referred to as "arylphosphonatooxy group"), cyano group, nitro group, aryl groups, alkenyl group and alkinyl groups.

As specific examples of the alkyl group in these substituents to be substituted on alkyl groups, the above-mentioned alkyl groups are listed likewise, and specific examples of the aryl group include a phenyl group, biphenyl group, naphthyl group, tolyl group, xylyl group, mesityl group, cumenyl group, fluorophenyl group, chlorophenyl group, bromophenyl group, chloromethylphenyl group, hydroxyphenyl group, methoxyphenyl group, ethoxyphenyl group, phenoxyphenyl group, acetoxyphenyl group, benzoyloxyphenyl group, methylthiophenyl group, phenylthiophenyl group, methylaminophenyl group, dimethylaminophenyl group, acetylaminophenyl group, carboxyphenyl group, methoxycarbonylphenyl group, ethoxycarbonylphenyl group, phenoxycarbonylphenyl group, N-phenylcarbamoylphenyl group, phenyl group, nitrophenyl group, cyanophenyl group, sulfophenyl group, sulfonatophenyl group, phosphonophenyl group, phosphonatophenyl group and the like.

As the substituent, aryl group to be substituted on alkyl groups, the above-exemplified aryl groups are listed likewise, and examples of the alkenyl group include a vinyl group, 1-propenyl group, 1-butenyl group, cinnamyl group, 2-chloro-1-ethenyl group and the like, and examples of the alkyl group include an ethinyl group, 1-propinyl group, 1-butinyl group, trimethylsilylethinyl group, phenylethinyl group and the like Of these substituents, more preferable examples thereof include halogen atoms (—F, —Br, —Cl, —I), alkoxy groups, aryloxy groups, alkylthio groups, arylthio groups, N-alkylamino groups, N,N-dialkylamino groups, acyloxy groups, N-alkylcarbamoyloxy groups, N-arylcarbamoyloxy groups, acylamino groups, formyl group, carboxyl group, alkoxycarbonyl groups, aryloxycarbonyl groups, carbamoyl group, N-alkylcarbamoyl groups, N,N-dialkylcarbamoyl groups, N-arylcarbamoyl groups, N-alkyl-N-arylcarbamoyl groups, sulfo group, sulfonato group, sulfamoyl group, N-alkylsulfamoyl groups, N,N-dialkylsulfamoyl groups, N-arylsulfamoyl groups, N-alkyl-N-arylsulfamoyl group, phosphono group, phosphonato group, dialkylphosphono groups, diarylphosphono groups, monoalkyl phosphono groups, alkylphosphonato groups, monoarylphosphono groups, arylphosphonato groups, phosphonooxy group, phosphonatooxy group, aryl groups, alkenyl groups and the like.

On the other hand, in substituted alkyl groups, as the alkylene group which is combined with a substituent to form a substituted alkyl group, divalent organic residues obtained by deleting any one hydrogen atom on the above-mentioned alkyl groups having 1 to 30 carbon atoms are listed, and preferable examples of $R^3$ to $R^9$ include straight chain alkylene groups having 1 to 12 carbon atoms, branched alkylene groups having 3 to 12 carbon atoms and cyclic alkylene groups having 5 to 10 carbon atoms. Preferable specific examples of the substituted alkyl group obtained by combining the above-mentioned substituent with an alkylene group include chloromethyl group, bromomethyl group, 2-chloroethyl group, trifluoromethyl group, methoxymethyl group, methoxyethoxyethyl group, allyloxymethyl group, phenoxymethyl group, methylthiomethyl group, tolylthiomethyl group, ethylaminoethyl group, diethylaminopropyl group, morpholinopropyl group, acetyloxymethyl group, benzoyloxymethyl group, N-cyclohexylcarbamoyloxyethyl group, N-phenylcarbamoyloxyethyl group, acetylaminoethyl group, N-methylbenzoylaminopropyl group, 2-oxoethyl group, 2-oxopropyl group, carboxypropyl group, methoxycarbonylethyl group, methoxycarbonylmethyl group, methoxycarbonylbutyl group, allyloxycarbonylbutyl group, chlorophenoxycarbonylmethyl group, carbamoylmethyl group, n-methylcarbamoylethyl group, N,N-dipropylcarbamoylmethyl group, N-(methoxyphenyl)carbamoylethyl group, N-methyl-N-(sulfonyl)carbamoylmethyl group, sulfopropyl group, sulfobutyl group, sulfonatobutyl group, sulfamoylbutyl group, N-ethylsulfamoylmethyl group, N,N-dipropylsulfamoylpropyl group, N-tolylsulfamoylpropyl group, N-methyl-N-(phosphonopheny l)sulfamoyloctyl group, phosphonobutyl group, phosphonatohexyl group, diethylphosphonobutyl group, diphenylphosphonopropyl group, methylphosphonobutyl group, methylphosphonatobutyl group, tolylphosphonohexyl group, tolylphosphonatohexyl group, phosphonooxypropyl group, phosphonooxybutyl group, benzyl group, phenethyl group, α-methylbenzyl group, 1-methyl-1-phenylethyl group, p-methylbenzyl group, cinnamyl group, allyl group, 1-propenylmethyl group, 2-butenyl group, 2-methylallyl group, 2-methylpropenylmethyl group, 2-propinyl group, 2-butinyl group, 3-butinyl group and the like.

As the above-mentioned aryl group represented by $R^1$ to $R^{10}$, those in which one to three benzene rings form a condensed ring and those in which a benzene ring and a 5-membered unsaturated ring form a condensed ring are listed, and specific examples thereof include a phenyl group, naphthyl group, anthryl group, phenanthryl group, indenyl group, acenabutenyl group and fluorenyl group, and of these groups, a phenyl group and naphthyl group are more preferable.

As the substituted aryl group, those having as a substituent a monovalent non-metal atom excepting hydrogen on a ring forming carbon atom of the above-mentioned aryl groups are used. As the preferable example of the substituent, the above-mentioned alkyl groups, substituted alkyl groups, and those exemplified as a subs tituent on substituted alkyl groups, are listed.

Preferable specific examples of such a substituted aryl group include a biphenyl group, tolyl group, xylyl group, mesityl group, cumenyl group, chlorophenyl group, bromophenyl group, fluorophenyl group, chloromethylphenyl group, trifluoromethylphenyl group, hydroxyphenyl group, methoxyphenyl group, methoxyethoxyphenyl group, allyloxyphenyl group, phenoxyphenyl group, methylthiophenyl group, tolylthiophenyl group, phenylthiophenyl group, ethylaminophenyl group, dimethylaminophenyl group, diethylaminophenyl group, morpholinophenyl group, acetyloxyphenyl group, benzoyloxyphenyl group, N-cyclohexylcarbamoyloxyphenyl group, N-phenylcarbamoyloxyphenyl group, acetylaminophenyl group, N-methylbenzoylaminophenyl group, carboxyphenyl group, methoxycarbonylphenyl group, allyloxycarbonylphenyl group, chlorophenoxycarbonylphenyl group, carbamoylphenyl group, N-methylcarbamoylphenyl group, N,N-dipropylcarbamoylphenyl group, N-(methoxyphenyl)carbamoylphenyl group, N-methyl-N-(sulfenyl)carbamoylphenyl group, sulfenyl group, sulfonatophenyl group, sulfamoylphenyl group, N-ethylsulfamoylphenyl group, N,N-dipropylsulfamoylphenyl group, N-tolylsulfamoylphenyl group, N-methyl-N-(phosphonophenyl)sulfamoylphenyl group, phosphonophenyl group, phosphonatophenyl group, diethylphosphonophenyl group, diphenylphosphonophenyl group, methylphosphonophenyl group, methylphosphonatophenyl group, tolylphosphonophenyl group, tolylphosphonatophenyl group, allylphenyl group, 1-propenylmethylphenyl group, 2-butenylphenyl group, 2-methylallylphenyl group, 2-methylpropenylphenyl group, 2-propinylphenyl group, 2-butinylphenyl group, 3-butinylphenyl group and the like.

Z represents a heptamethine group which may have a substituent. When a heptamethine group has a substituent, examples of the substituent include alkyl groups having 8 or less carbon atoms, halogen atoms, alkoxy groups, aryloxy groups, alkylthio groups, arylthio groups, N-alkylamino groups, N,N-dialkylamino groups, N-arylamino groups, N,N-diarylamino groups, hetero cyclic groups and the like, and these substituents may be further substituted with the same substituents as exemplified to $R^1$ to $R^6$.

Among them, from the standpoints of absorption wavelength suitability as an infrared absorbing agent and easiness of synthesis thereof, preferable are a heptamethine group having no substituent, a heptamethine group having a halogen atom as a substituent, a heptamethine group having arylthio group as a substituent, a heptamethine group having N,N-diarylamino group as a substituent, and the like.

This heptamethine group may be one containing a cyclohexene ring or cyclopentene ring formed by mutual connection of substituents on two methane carbons. One or more ring structures as described above may be present in heptamethine. These ring structures may have a substituent, and as the substituent on this ring structure, alkyl groups having 6 or less carbon atoms and halogen atoms are listed. Among them, alkyl groups having 6 or less carbon atoms and the like are preferable from the standpoint of easiness of synthesis.

Q represents a counter ion, and may form a bond with $R^1$ to $R^6$ to give an intramolecular salt. This counter ion Q is not particularly limited, and any ion known as a counter ion of a known infrared absorption colorant can be applied providing it is suitable for absorption wavelength range of an infrared absorbing agent.

As this counter ion, those represented by the above-mentioned general formula (II) are preferable, and in the formula, A represents an atom selected from the group consisting of B, P, As, Sb, Cl and Br, and B, P, Sb and Cl are preferable from the standpoints of easiness of synthesis and safety of a compound.

Y represents a halogen atom, for example, Cl, I, Br, F and the like or an oxygen atom. Among them, Y preferably represents a fluorine or oxygen atom from the standpoint of easiness in raw material availability.

m represents an integer of 1 to 6, and preferably in the range from 4 to 6.

Preferable counter ions Q in this embodiment will be listed below, but Q is not restricted to them.

$ClO_4^-$ $BrO_4^-$ $BF_4^-$ $PF_6^-$ $SbF_6^-$ $Br^-$ $I^-$

As Q, those having a sulfonic acid structure in the structure are also preferably used.

Examples of the counter anion having a sulfonic acid structure which can be used as a counter ion Q in an infrared absorbing agent in this embodiment include the following ions.

1) methanesulfonate ion,
2) ethanesulfonate ion,
3) 1-propanesulfonate ion,
4) 2-propanesulfonate ion,
5) n-butanesulfonate ion,
6) allylsulfonate ion,
7) 10-camphorsulfonate ion,
8) trifluoromethanesulfonate ion,
9) pentafluoroethanesulfonate ion,
10) benzenesulfonate ion,
11) p-toluenesulfonate ion,
12) 3-methoxybenzenesulfonate ion,
13) 4-methoxybenzenesulfonate ion,
14) 4-hydroxybenzenesulfonate ion,
15) 4-chlorobenzenesulfonate ion,
16) 3-nitrobenzenesulfonate ion,
17) 4-nitrobenzenesulfonate ion,
18) 4-acetylbenzenesulfonate ion,
19) pentafluorobenzenesulfonate ion,
20) 4-dodecylbenzenesulfonate ion,
21) mesitylenesulfonate ion,
22) 2,4,6-triisopropylbenzenesulfonate ion,
23) 2-hydroxy-4-methoxybenzophenone-5-sulfonate ion,
24) dimethyl isophthalate-5-sulfonate ion,
25) diphenylamine-4-sulfonate ion,
26) 1-naphthalenesulfonate ion,
27) 2-naphthalenesulfonate ion,
28) 2-naphthol-6-sulfonate ion,
29) 2-naphthol-7-sulfonate ion,
30) anthraquinone-1-sulfonate ion,
31) anthraquinone-2-sulfonate ion,
32) 9,10-dimethoxyanthracene-2-sulfonate ion,
33) 9,10-diethoxyanthracene-2-sulfonate ion,
34) quinoline-8-sulfonate ion,
35) 8-hydroxyquinoline-5-sulfonate ion,
36) 8-anilino-naphthalene-1-sulfonate ion.

A method for producing an infrared absorbing agent represented by the general formula (I) will be described below.

The infrared absorbing agent represented by the general formula (I) can be produced by a known organic synthesis technology. As specific synthesis methods, there are listed methods described in U.S. Pat. No. 5,441,866, Zh. Org. Khim. vol. 28, (No. 10), 1992, pp. 2159 to 2164, EU Patent No. 464,543, A1.

Specific examples [(IR-1) to (IR-30)] of the infrared absorbing agent represented by the general formula (I) are listed below, but do not limit the scope of the infrared absorbing agent of this embodiment.

(IR-1)

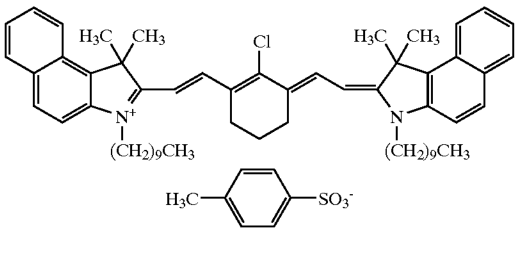

-continued
(IR-2)
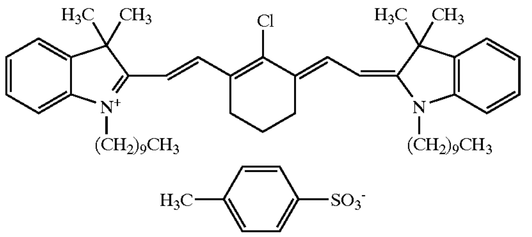
(IR-3)
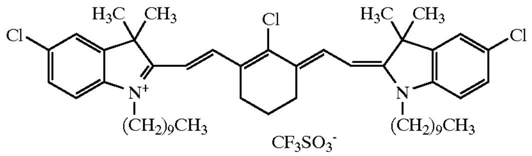
(IR-4)
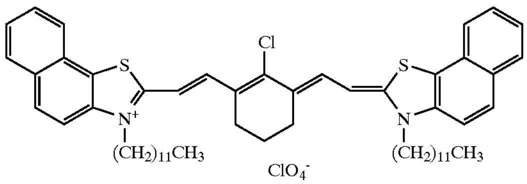
(IR-5)
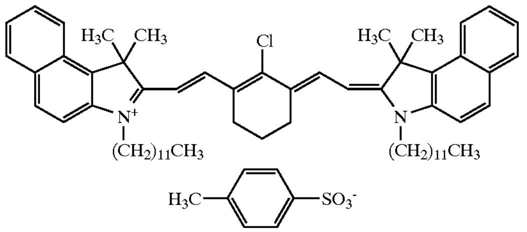
(IR-6)
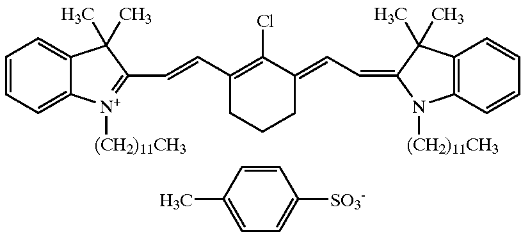
(IR-7)
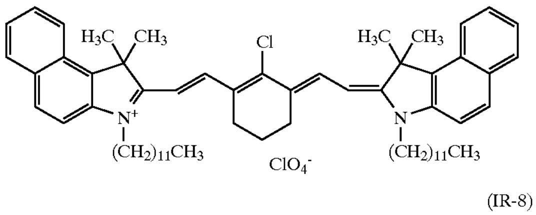
(IR-8)
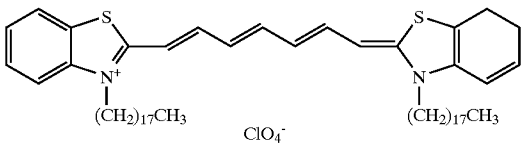
-continued
(IR-9)
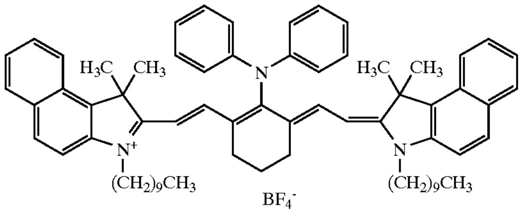
(IR-10)
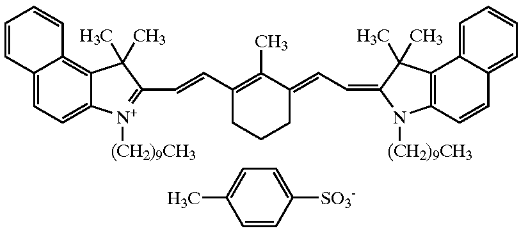
(IR-11)
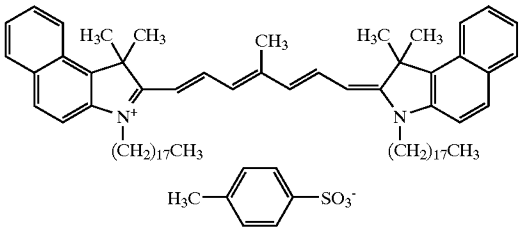
(IR-12)
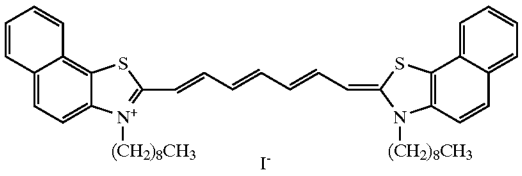
(R-13)
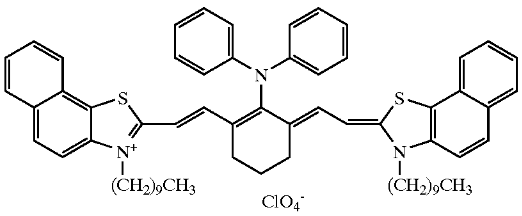
(R-14)
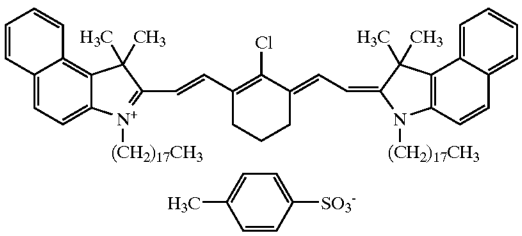
(R-15)
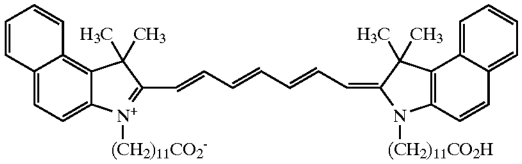

-continued
(R-16)
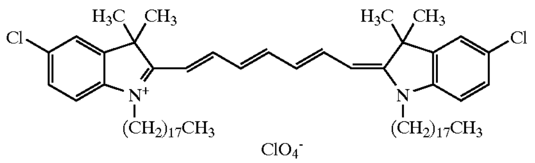
(IR-17)
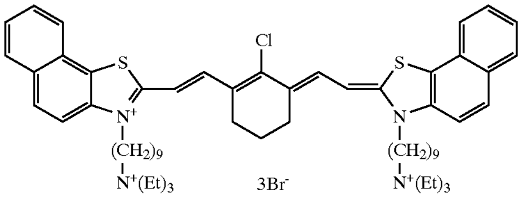
(IR-18)
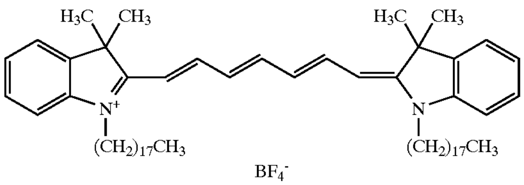
(IR-19)
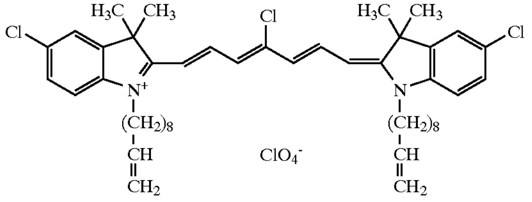
(IR-20)
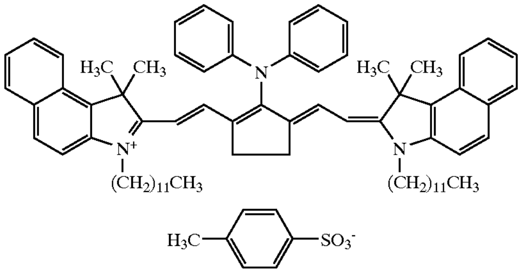
(IR-21)
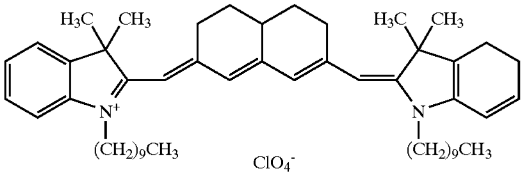
(IR-22)
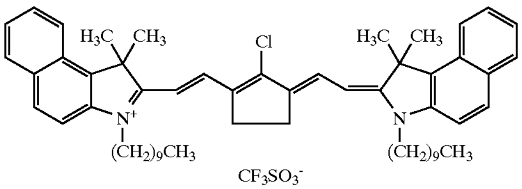
-continued
(IR-23)
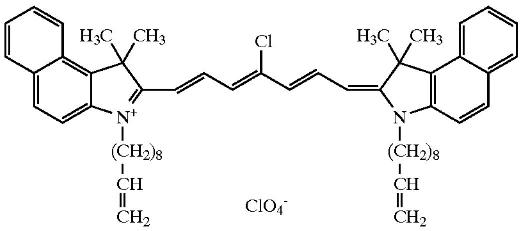
(IR-24)
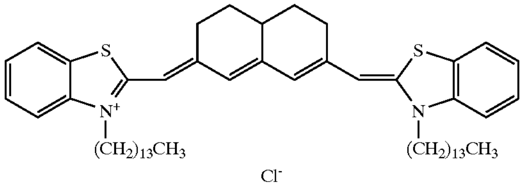
(IR-25)
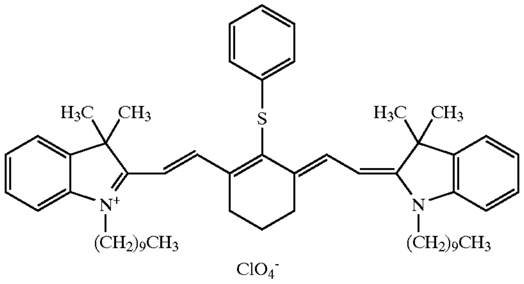
(IR-26)
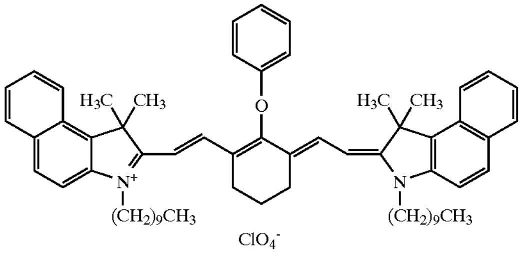
(IR-27)
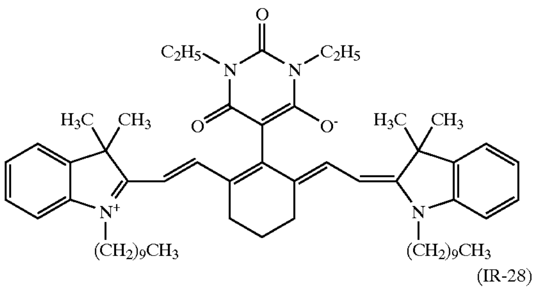
(IR-28)
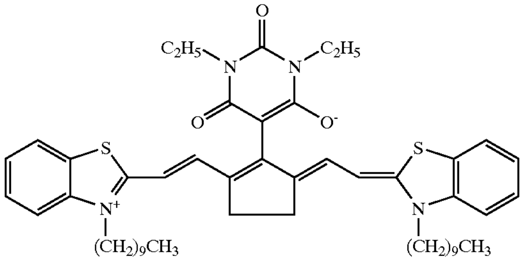

-continued (IR-29)

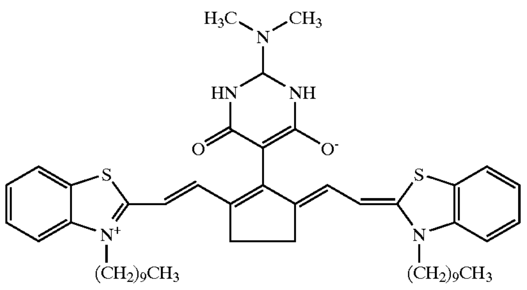

(IR-30)

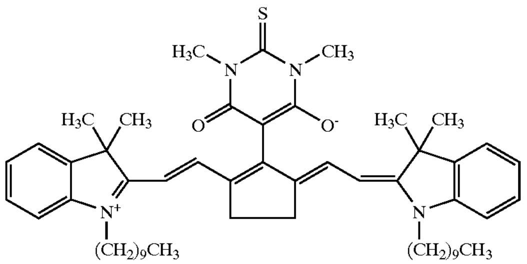

In the present embodiment, the above-mentioned infrared absorbing agent can be added in an amount of 0.01 to 50% by weight, preferably of 0.1 to 20% by weight, more preferably of 0.5 to 15% by weight based on the total solid amount of a photosensitive composition. If the addition amount is less than 0.01% by weight, an image can not be formed by this photosensitive composition, and if added in an amount of over 50% by weight, there is a fear of generation of stains on non-image portions when the composition used in a photosensitive layer of a planographic printing plate.

In a photosensitive composition of this embodiment, other pigment or dye having infrared ray absorbing properties can be added for the purpose of improving image forming properties, in addition to the above-mentioned infrared absorbing agent.

As the pigment, there can be used commercially available pigment and those described in Color Index (C. I.) manual, “Saishin Ganryo Binran (current pigment manual)” (Nippon Ganryo Gijutsu Kyokai, 1977), “Saishin Ganryo Oyo Gijutsu (current pigment application technology)” (CMC, 1986), “Insatsu Ink Gijutsu (printing ink technology)” (CMC, 1984).

As the pigment, black pigments, yellow pigments, orange pigments, brown pigments, red pigments, violet pigments, blue pigments, green pigments, fluorescent pigments, metal powder pigments, and other polymer bond pigments are listed. Specifically, there can be used insoluble azo pigments, azolake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, staining lake pigments, azine pigments, nitroso pigments, nitro pigments, natural pigments, fluorescent pigments, inorganic pigments, carbon black and the like.

These pigments may or may not be subjected to surface treatment. As the surface treatment method, there are envisaged a method in which a resin or wax is coated on the surface, a method in which a surfactant is adhered, a method in which a reactive substance (for example, a silane coupling agent, epoxy compound, polyisocyanate and the like) is bonded to the surface of a pigment, and the like. The above-mentioned surface treatment methods are described in “Kinzoku Sekken no Seishitsu to Oyo (nature and application of metal soap)” (Sachi Publication), “Insatsu Ink Gijutsu (printing ink technology)” (CMC, 1984), and “Saishin Ganryo Oyo Gijutsu (current pigment application technology)” (CMC, 1986).

The particle size of a pigment is preferably in the range from 0.01 μm to 10 μm, and further preferably in the range from 0.05 μm to 1 μm, particularly, in the range from 0.1 μm to 1 μm. If the particle size of a pigment is less than 0.01 μm, stability of a dispersed material in a photosensitive layer coating solution is not preferable, while if over 10 μm, uniformity of a photosensitive layer deteriorates.

For dispersing a pigment, known dispersing technologies used in producing an ink and toner and the like can be used. As the dispersing machine, a supersonic dispersing apparatus, sandmill, attritor, pearl mill, super mill, ball mill, impeller, disperser, KD mill, colloid mill, dinatron, three-roll mill, press kneader and the like are listed. The details are described in “Saishin Ganryo Oyo Gijutsu (current pigment application technology)” (CMC, 1986).

As the dye, there can be used commercially available dyes and those described in literatures (for example, “Senryo Binran (pigment manual)” (Yuki Gosei Kagaku Kyokai, 1970)). Specific examples thereof include azo dyes, metal complex salt azo dyes, pyrazolone azo dyes, anthraquinone dyes, phthalocyanine dyes, carbonium dyes, quinoneimine dyes, methine dyes, cyanine dyes, diimonium dyes, aminium dyes and the like.

In this embodiment, among these pigments or dyes, those absorbing an infrared ray or near infrared ray are particularly preferable since they are suitable for use of laser emitting an infrared ray or near infrared ray.

As such a pigment absorbing an infrared ray or near infrared ray, carbon black is suitably used. Further, examples of the pigment absorbing an infrared ray or near infrared ray include cyanine dyes described in JP-A Nos. 58-125246, 59-84356, 59-202829, 60-78787 and the like, methine dyes described in JP-A Nos. 58-173696, 58-181690, 58-194595 and the like, naphthoquinone dyes described in JP-A Nos. 58-112793, 58-224793, 59-48187, 59-73996, 60-52940, 60-63744 and the like, squarylium pigments described in JP-A No. 58-112792 and the like, cyanine dyes described in GB Patent No. 434,875, dihydroperimidinesquarylium dyes described in U.S. Pat. No. 5,380,635, and the like.

Further, as the dye, near infrared absorption sensitizers described in U.S. Pat. No. 5,156,938 are also used suitably, and further, there are particularly preferably used arylbenzo (thio)pyrylium salts described in U.S. Pat. No. 3,881,924, trimethine thiopyrylium salts described in JP-A No. 57-142645 (U.S. Pat. No. 4,327,169), pyrylium-based compounds described in JP-A Nos. 58-181051, 58-220143, 59-41363, 59-84248, 59-84249, 59-146063 and 59-146061, cyanine pigments described in JP-A No. 59-216146, pentamethine thiopyrylium salts described in U.S. Pat. No. 4,283,475, and pyrylium compounds disclosed in Japanese Patent Application Publication (JP-B) Nos. 5-13514 and 5-19702 and the like, and Epolight III-178, Epolight III-130, Epolight III-125, Epolight IV-62A (manufactured by Eporin) and the like as commercially available products.

As particularly preferable other examples of the dye, near infrared absorbing dyes represented by the formula (I) and (II) in U.S. Pat. No. 4,756,993 are listed.

The pigments or dyes can be added in an amount of 0.01 to 50% by weight, preferably of 0.1 to 10% by weight, and in the case of a dye, particularly preferably of 0.5 to 10% by weight and in the case of a pigment, particularly preferably of 3.1 to 10% by weight based on the total solid content of a printing plate material. When the addition amount of the pigment or dye is less than 0.01% by weight, sensitivity decreases, while when over 50% by weight, uniformity of a photosensitive layer is lost and durability of a recorded layer deteriorates.

These dyes or pigments may be added to a photosensitive composition and added together with other components to a photosensitive layer, and alternatively, in producing a planographic printing plate, a layer other than a photosensitive layer may be provided to which the dyes or pigments are added. These dyes or pigments may be added alone or in admixture of two or more.

[(b) Aqueous Alkali Solution-soluble Resin]

(b) An aqueous alkali solution-soluble polymer compound used in the present embodiment is a compound having an acid group structure described below on the backbone chain or side chain of the polymer compound.

Phenolic hydroxyl group (—Ar—OH), carboxyl group ($—CO_2H$), sulfonate group ($—SO_3H$), phosphate group ($—OPO_3H$), sulfoneamide group ($—SO_2NH—R$), substituted sulfoneamide-based acid group (active imide group) ($—SO_2NHCOR$, $—SO_2NHSO_2R$, $—CONHSO_2R$).

Wherein, Ar represents a divalent aryl group which may have a substituent, and R represents a hydrocarbon group which may have a substituent.

Among these examples, (b-1) phenolic hydroxyl group, (b-2) sulfoneamide group, (b-3) active imide group are listed as a preferable acid group, and an aqueous alkali solution-soluble resin having (b-1) a phenolic hydroxyl group (hereinafter, referred to as "resin having a phenolic hydroxyl group") can be used most preferably.

Examples of a polymer compound having (b-1) a phenolic hydroxyl group include novolak resin such as polycondensates of phenol and formaldehyde (hereinafter, referred to as "phenolformaldehyde resin"), polycondensates of m-cresol and formaldehyde (hereinafter, referred to as "m-cresolformaldehyde resin"), polycondensates of p-cresol and formaldehyde, polycondensates of m-/p-mixed cresol and formaldehyde, polycondensates of phenol and cresol (any of m-, p-, or m-/p-mixture) and formaldehyde, and the like, and polycondensates of pyrogallol and acetone. Alternatively, copolymers obtained by copolymerizing monomers having a phenol group on the side chain can also be used. As such monomers having a phenol group, acrylamide, methacrylamide, acrylate, methacrylate or hydroxystyrene having a phenol group are listed. Specifically, there can be suitably used N-(2-hydroxyphenyl)acrylamide, N-(3-hydroxyphenyl) acrylamide, N-(4-hydroxyphenyl)acrylamide, N-(2-hydroxyphenyl)acrylamide, N-(2-hydroxyphenyl) methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate, 2-(4-hydroxyphenyl) ethyl methacrylate, 2-(N'-(4-hydroxyphenyl)ureido)ethyl acrylate, 2-(N'-(4-hydroxyphenyl)ureido)ethyl methacrylate and the like.

Polymers having a weight average molecular weight of $5.0\times10^2$ to $2.0\times10^5$ and a number average molecular weight of $2.0\times10^2$ to $1.0\times10^5$ are preferable from the standpoint of image forming ability. These resins may be used alone or in combination of two or more. When used in combination, there may be simultaneously used polycondensates of formaldehyde with phenol having as a substituent an alkyl group having 3 to 8 carbon atoms such as a polycondensate of t-butylphenol with formaldehyde, and polycondensated of octylphenol with formaldehyde, as described in U.S. Pat. No. 4,123,279.

Further, as described in U.S. Pat. No. 4,123,279, there may also be simultaneously used polycondensates of formaldehyde with phenol having as a substituent an alkyl group having 3 to 8 carbon atoms such as a t-butylphenolformaldehyde resin, octylphenolformaldehyde resin. Such resins having a phenolic hydroxyl group may be used alone or in combination of two or more.

In the case of an aqueous alkali solution-soluble polymer compound having (b-2) a sulfone amide group, as the monomer having (b-2) a sulfone amide group, which is the main monomer constituting this polymer compound, there are listed monomers composed of a lower molecular weight compound having one or more sulfoneamide groups in which at least one hydrogen atom is bonded at a nitrogen atom and one ore more polymerizable unsaturated bonds, in one molecule. Among them, lower molecular weight compounds having an acryloyl group, allyl group or vinyloxy group, and a substituted or mono-substituted aminosulfonyl group or substituted sulfonylimino group are preferable.

Examples of these compound include the following compounds represented by the general formulae (4) to (8) described below.

(4)

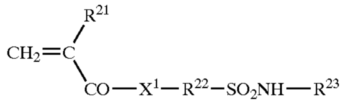

(5)

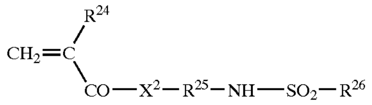

(6)

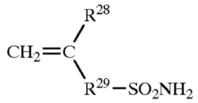

(7)

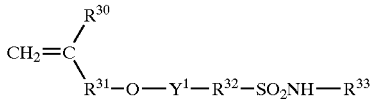

(8)

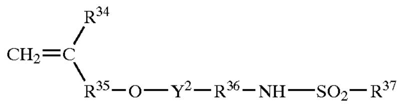

In the general formulae, each of $X^1$ and $X^2$ independently represents —O— or $—NR^{17}—$. Each of $R^{21}$ and $R^{24}$ independently represents a hydrogen atom or $—CH_3$. Each of $R^{22}$, $R^{25}$, $R^{29}$, $R^{32}$ and $R^{36}$ independently represents an alkylene group having 1 to 12 carbon atoms, cycloalkylene group, arylene group or aralkylene group, which may have a substituent. Each of $R^{23}$, $R^{17}$ and $R^{33}$ independently represents a hydrogen atom, an alkyl group having 1 to 12 carbon atoms, cycloalkyl group, aryl group or aralkyl group, which may have a substituent. Each of $R^{26}$ and $R^{37}$ independently represents an alkyl group having 1 to 12 carbon atoms, cycloalkyl group, aryl group or aralkyl group, which may have a substituent. Each of $R^{28}$, $R^{30}$ and $R^{34}$ independently represents a hydrogen atom or —$CH_3$. Each of $R^{31}$ and $R^{35}$ independently represents a single bond, or an alkylene group having 1 to 12 carbon atoms, cycloalkylene group, arylene group or aralkylene group, which may have a substituent. Each of $Y^1$ and $Y^2$ independently represents a single bond or —CO—.

Specifically, m-aminosulfonylphenyl methacrylate, N-(p-aminosulfonylphenyl) methacrylamide, N-(p-aminosulfonylphenyl)acrylamide and the like can be suitably used.

In the case of an aqueous alkali solution-soluble polymer compound having (b-3) an active imide group, as the monomer having (b-3) an active imide group, which has in the molecule an active imide group represented by the following formula and which is the main monomer constituting this polymer compound, there are listed monomers composed of a lower molecular weight compound having one or more active imino groups represented by the following formula and one ore more polymerizable unsaturated bonds, in one molecule.

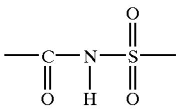

As these compounds, there can be suitably used N-(p-toluenesulfonyl)methacrylamide, N-(p-toluenesulfonyl) acrylamide and the like, specifically.

In the aqueous alkali solution-soluble copolymer which can be used in the present embodiment, the monomer containing acidic groups of (b-1) to (b-3) is not necessarily restricted to one kind, two or more monomers having the same acidic group or two or more monomers having different acidic groups may be copolymerized.

As the copolymerization method, a graft copolymerization method, block copolymerization method, random copolymerization method and the like conventionally known can be used.

The above-mentioned copolymer contains, as a copolymerization component, monomers having an acidic group (b-1) to (b-3) to be copolymerized in an amount preferably of 10 mol % or more, and more preferably of 20 mol % or more. When the amount of the copolymerization component is less than 10 mol %, mutual action with a resin having a phenolic hydroxyl group become insufficient, and an effect of improving development latitude which is a merit when the copolymer component is used becomes insufficient.

Further, this copolymer may contain other copolymerization components than the above-mentioned monomer containing an acidic group (b-1) to (b-3).

As the monomer which can be used as a copolymerization component, the following monomers (1) to (12) can be used.

(1) Acrylates and methacrylates having and aliphatic hydroxyl group such as, for example, a 2-hydroxyethyl acrylate, 2-hydroxyethyl methacrylate or the like.

(2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, N-dimethylaminoethyl acrylate and the like.

(3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, N-dimethylaminoethyl methacrylate and the like.

(4) Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide and the like.

(5) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether and the like.

(6) Vinyl esters such as vinyl acetate, vinylchloro acetate, vinylbutyrate, vinyl benzoate and the like.

(7) Styrenes such as styrene, α-methylstyrene, methylstyrene, chloromethylstyrene and the like.

(8) Vinyl ketones such as methyl vinyl ketone, ethyl vinyl ketone, propyl vinyl ketone, phenyl vinyl ketone and the like.

(9) Olefins such as ethylene, propylene, isobutylene, butadiene, isoprene and the like.

(10) N-vinylpyrrolidone, N-vinylcarbazole, 4-vinylpyridine, acrylonitrile, methacrylonitrile and the like.

(11) Unsaturated imides such as Maleimide, N-acryloylacrylamide, N-acetylmethacrylamide, N-propionylmethacrylamide, N-(p-chlorobenzoyl) methacrylamide and the like.

(12) Unsaturated carboxylic acids such as acrylic acid, methacrylic acid, maleic anhydride, itaconic acid and the like.

As the aqueous alkali solution-soluble polymer compound in this embodiment, compounds having a weight average molecular weight of 2000 or more and a number average molecular weight of 500 or more are preferable from the standpoint of film strength, irrespective of a homopolymer or copolymer. Further preferable compounds have a weight average molecular weight of 5000 to 300000 and a number average molecular weight of 800 to 250000, and a degree of dispersion (weight average molecular weight/number average molecular weight) of 1.1 to 10.

In the above-mentioned copolymer, the compounding ratio by weight of a monomer having an acidic group (b-1) to (b-3) to other monomer is preferably in the range from 50:50 to 5:95, more preferably in the range from 40:60 to 10:90 from the standpoint of development latitude.

As the polymer compound having a phenolic hydroxyl group preferable in the present embodiment, there are listed novolak resins such as a polycondensate of m-/p-mixed cresol with formaldehyde, a polycondensate of phenol and cresol and formaldehyde, and the like, a copolymer of N-(4-hydroxyphenyl) methacrylamide/methyl methacrylate/acrylonitrile, a copolymer of 2-(N'-4-hydroxyphenyl)ureido) ethyl methacrylate/methyl methacrylate/acrylonitrile, and the like.

As the polymer compound having a sulfoneamide group preferable in the present embodiment, there are listed a copolymer of N-(p-aminosulfonylphenyl)methacrylamide/methyl methacrylate/acrylonitrile, and the like, and as the polymer compound having an active imide group, there are listed a copolymer of N-(p-toluenesulfonyl) methacrylamide/methyl methacrylate/acrylonitrile/2-hydroxyethyl methacrylate, and the like.

These aqueous alkali solution-soluble polymer compounds may be used alone or in combination of two or more, and used in a addition amount of 30 to 99% by weight, preferably of 40 to 95% by weight, particularly preferably of 50 to 90% by weight based on the total solid content of a photosensitive composition. When the addition amount of the aqueous alkali solution-soluble polymer compound is less than 30% by weight, durability of a recording layer deteriorates, while when over 99% by weight, both of sensitivity and durability are not preferable.

[Other components]

In a photosensitive composition of the present embodiment, various additive can further be added, if necessary. For example, when other onium salt, aromatic sulfone compound, aromatic sulfonate compound, polyfunctional amine compound and the like are added, an ability to suppress dissolution of an aqueous-alkali-solution-soluble polymer to a developer can be improved, meaning preferable phenomenon.

As the above-mentioned onium salt a diazonium salt, ammonium salt, phosphonium salt, iodonium salt, sulfonium salt, selenonium salt, arsonium salt and the like are listed. Preferably examples of the onium salt used in the present embodiment include diaoznium salts described in S. I. Schlesinger, Photogr. Sci. Eng., 18, 387 (1974), T. S. Bal et al, Polymer 21. 423 (1980), or JP-A No. 5-158230, ammonium salts described in U.S. Pat. Nos. 4,069,055 and 4,069,056 or JP-A No. 3-140140, phosphonium salts described in D. C. Necker et al, Macromolecules, 17, 2468 (1984), C. S. Wen et al, The, Proc. Conf. Rad. Curing ASIA, p478 Tokyo, October (1988), U.S. Pat. Nos. 4,069,055 or 4,069,056, iodonium salts described in J. V. Crivello et al, Macromolecules, 10(6), 1307 (1977), Chem. & Eng. News, Nov. 28, p31 (1988), EU Patent No. 104,143, U.S. Pat. Nos. 339,049, 410,201, JP-A No. 2-150848 or 2-296514, sulfonium salts described in J. V. Crivello et al., Polymer J. 17, 73 (1985), J. V. Crivello et al., J. Org. Chem., 43, 3055 (1978), W. R. Watt et al, J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 1877 (1979), EU Patent Nos. 370,693, 233,567, 297,443, 297,442, U.S. Pat. Nos. 4,933,377, 3,902,114, 410, 201, 339,049, 4,760,013, 4,734,444, 2,833,827, German Patent Nos. 2,904,626, 3,604,580, 3,604,581, selenonium salts described in J. V. Crivello et al., Macromolecules, 10(6), 1307 (1977), or J. V. Crivello et al., J. Polymer Sci., Polymer Chem. Ed., 17, 1047 (1979), arsonium salts described in C. S. Wen et al., The, Proc. Conf. Rad. Curing ASIA, p478 Tokyo, October (1988), and the like.

As the counter ion of the above-mentioned onium salt, there are listed tetrafluoroboric acid, hexafluorophophosric acid, triisopropylnaphthalenesulfonic acid, 5-nitro-o-toluenesulfonic acid, 5-sulfosalicyclic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, p-toluenesulfonic acid and the like.

Among them, particularly, hexafluoride phosphoric acid and triisopropylnaphthalenesulfonic acid, and alkyl aromatic sulfonic acids such as 2,5-dimethylbenzenesulfonic acid and the like, are suitable.

The above-mentioned onium salt is added in an amount preferably of 1 to 50% by weight, more preferably of 5 to 30% by weight, particularly preferably of 10 to 30% by weight, based on the total solid content of materials constituting the first layer.

For further improving sensitivity, cyclic acid anhydrides, phenols, organic acids can be used simultaneously. As the cyclic acid anhydride, there are listed phthalic anhydride, tetrahydrophthalic anhydride, hexahydrophthalic anhydride, 3.6-endooxy-Δ4-tetrahydrophthalic anhydride, tetrachlorophthalic anhydride, maleic anhydride, chloromaleic anhydride, α-phenylmaleic anhydride, succinic anhydride, pyromellitic anhydride and the like as described in U.S. Pat. No. 4,115,128. As the phenols, there are listed bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane and the like. Further, as the organic acids, there are listed sulfonic acids, sulfinic acid, alkylsulfuric acids, phosphonic acids, phosphates and carboxylic acids described in JP-A Nos. 60-88942 and 2-96755 and the like, and specific examples thereof include p-toluenesulfonic acid, dodecylbenzensulfonic acid, p-toluenesulfinic acid, ethylsulfuric acid, phenylphosphonic acid phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid and the like.

The proportion of the above-mentioned cyclic acid anhydrides, phenols and organic acids occupying a printing material is preferably from 0.05 to 20% by weight, more preferably from 0.1 to 15% by weight, particularly preferably from 0.1 to 10% by weight.

In a printing plate material of the present embodiment, nonionic surfactants described in JP-A Nos. 62-251740 and 3-208514, and ampholytic surfactants described in JP-A Nos. 59-121044 and 4-13149 can be added, for increasing stability of treatment against developing conditions.

Specific examples of the nonionic surfactant include sorbitan tristearate, sorbitan monopalmitate, sorbitan trioleate, stearic acid monoglyceride, polyoxyethylene nonylphenyl ether and the like.

Specific examples of the ampholytic surfactant include alkyldi(aminoethyl)glycine, alkylpolyaminoethylglycine hydrochloride, 2-alkyl-N-carboxyethyl-N-hydroxyethylimidazolinium betaine and N-tetradecyl-N,N-betaine type compounds (for example, trade name: "Amogen K", manufactured by Daiichi Kogyo K.K.), and the like.

The proportion of the above-mentioned nonionic surfactants and ampholytic surfactants occupying a printing plate material is preferably from 0.05 to 15% by weight, more preferably from 0.1 to 5% by weight.

To a printing plate material of the first embodiment, a printing-out agent for providing a visible image immediately after heating by exposing; and a pigment or a dye as an image coloring agent can be added.

As the printing-out agent, a combination of a compound (a photo-acid emitting agent) capable of emitting an acid by heating by exposure and an organic dye capable of forming a salt can be typically enumerated. Specifically, a combination of o-naphthoquinoneazido-4-sulfonic acid halogenide and a salt-forming organic dye, as disclosed in each of JP-A Nos. 50-36209 and 53-8128; and a combination of trihalomethyl compound and a salt-forming organic dye, as disclosed in each of JP-A Nos. 53-36223, 54-74728, 60-3626, 61-143748, 61-151644 and 63-58440 can be enumerated. As the trihalomethyl compound, there exist an oxazole compound and a triazine compound, each of which is excellent in time-stability and provides a distinct printing-out image.

As the image coloring agent, other dyes can be used in addition to the abovementioned salt-forming organic dye. As suitable dyes, an oil soluble dye and a basic dye can be enumerated as well as the salt-forming organic dye. Specifically, Oil Yellow #101, Oil Yellow #103, Oil Pink #312, Oil Green BG, Oil Blue BOS, Oil Blue #603, Oil Black BY, Oil Black BS and Oil Black T-505 (which manufactured by ORIENT CHEMICALS Ltd.), Victoria Pure Blue, Crystal Violet (CI42555), Methyl Violet (CI42535), Ethyl Violet, Rhodamine B(CI145170B), Malachite Green (CI42000), Methylene Blue (CI52015) and the like can be enumerated. Indeed, dyes disclosed in JP-A No. 62-293247 are in particular preferred. These dyes can be added to a printing plate material in a ratio of 0.01 to 10% by weight, preferably 0.1 to 3% by weight of the whole solids of the printing plate material.

Additionally, to the printing plate material of the first embodiment, if necessary, a plasticizer may be added in order to provide the flexibility for a coating. As the plasticizer, for example, poly(ethylene glycol), tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer and a polymer of acrylic acid or methacrylic acid, and the like can be used.

Furthermore, in addition thereto, an epoxy compound; vinyl ethers; and a phenol compound having an alkoxymethyl group and a phenol compound having a hydroxymethyl group as disclosed in JP-A No. 8-276558; and a crosslinking compound having an action of inhibiting alkali dissolution as disclosed in Japanese Patent Application No. 9-328937; or the like can be suitably added thereto according to an object.

A planographic printing plate of the present embodiment can be produced by dissolving in a solvent the components of the photosensitive layer coating solution containing the photosensitive component of the present embodiment and the components of a coating solution for a desired layer such as a protecting layer, and applying the coating solution(s) on an appropriate support. Hereupon, as the solvent used, ethylene dichloride, cyclohexanone, methyl ethyl ketone, methanol, ethanol, propanol, ethylene glycol monomethyl ether, 1-methoxy-2-propanol, 2-methoxyethylacetate, 1-methoxy-2-propylacetate, dimethoxyethane, methyl lactate, ethyl lactate, N, N-dimethylacetoamide, N,N-dimethylformamide, tetramethylurea, N-methylpyrrolidone, dimethyl sulfoxide, sulfolane, γ-butyrolactone, toluene, water and the like can be enumerated, to which the solvent is not limited. Each of the solvents is used by alone or in the form of a mixture. The concentration of the above component (as the whole solids including an additive agent) in a solvent is preferably 1 to 50% by weight. Furthermore, an applied amount (as solids) to a substrate as obtained after applying and drying, which is varied according to a use, is commonly and preferably 0.5 to 5.0 g/$m^2$ as for a photosensitive printing plate.

As a method of coating, various methods can be used, for example, Bar-coater coating, Rotation coating, Spray coating, Curtain coating, Dip coating, Air knife coating, Blade coating, Roll coating and the like can be enumerated. The smaller an applied amount becomes, the greater an apparent photographic sensitivity becomes, but the film properties of a photosensitive layer are decreased.

To a coating liquid applied to a photosensitive layer in which a photosensitive composition of the first embodiment is used, a surfactant to improve applicability, for example, a fluorine-containing surfactant as disclosed in JP-A No. 62-170950 can be added. An amount to be added is preferably 0.01 to 1% by weight, more preferably 0.05 to 0.5% by weight of the whole printing plate material.

As a substrate which is used for a planographic printing plate in the first embodiment, a flat material which is stable in dimension, for example, paper; paper to which a plastic such as polyethylene, polypropylene or polystyrene is laminated; a plate of a metal such as aluminum, zinc or copper; a film of a plastic such as cellulose diacetate, cellulose triacetate, cellulose propionate, cellulose butyrate, cellulose acetate butyrate, cellulose nitrate, poly(ethylene terephthalate), polyethylene, polystyrene, polypropylene, polycarbonate, poly(vinyl acetal); paper or a plastic film to which a metal as mentioned above is laminated or deposited; and the like are included.

As a substrate which is used for a planographic printing plate of the first embodiment, a polyester film and an aluminum plate are preferred, and an aluminum plate, which is stable in dimension and relatively cheap, is in particular preferred among others. A suitable aluminum plate is a pure aluminum plate or an alloyed plate including aluminum as a main component and including a different element(s) in a very small amount, and furthermore a plastic film to which aluminum is laminated or deposited is also suitable. The different element(s) which may be included in the aluminum alloy includes silicon, iron, manganese, copper, magnesium, chromium, zinc, bismuth, nickel, titanium or the like. The content of the different element(s) in the alloy is 10% by weight or less. A particularly suitable aluminum in the present invention is a pure aluminum. However, as it is difficult to manufacture a perfectly pure aluminum in terms of current refining technologies, aluminum including a different element(s) in a very small amount may be used. Thus, an aluminum plate as applied to the present invention is not specified in composition, and a suitable aluminum plate which is conventionally and publicly known or used as a raw material can be utilized. The thickness of an aluminum plate used in the present invention is approximately 0.1 mm to 0.6 mm, preferably 0.15 mm to 0.4 mm, more preferably 0.2 mm to 0.3 mm.

Before surface-roughening an aluminum plate, if desired, a degreasing treatment with a surfactant, an organic solvent, an alkaline aqueous solution or the like is carried out so as to remove a rolling oil on the surface thereof.

A surface-roughening treatment for the surface of an aluminum plate is carried out according to various methods: for example, a method of mechanically surface-roughening, a method of surface-roughening by electrochemically dissolving the surface, and a method of surface-roughening by chemically and selectively dissolving the surface. As the mechanical surface-roughening method, a publicly known method such as Ball Polishing method, Brush Polishing method, Blast Polishing method, or Buff Polishing method can be used. As the electrochemical surface-roughening method, a method of using alternating current or direct current in an electrolyte of hydrochloric acid or nitric acid is enumerated. Furthermore, amethod in which both are combined with each other, as disclosed in JP-A No. 54-63902, can be also utilized.

A surface-roughened aluminum plate as mentioned above is, if necessary, subjected to an alkaline etching and neutralizing processes, and thereafter, if desired, anodized so as to enhance water-holding properties and wear and abrasion resistance. As an electrolyte as used for anodizing the aluminum plate, various electrolytes capable of forming a porous oxide film can be used. Commonly, sulfuric acid, phosphoric acid, oxalic acid, chromic acid, or a mixed acid thereof can be used. The concentration of such an electrolyte is properly determined depending upon a type of the electrolyte.

Conditions for anodizing treatment may change depending upon an electrolyte used, and thus can not be wholly specified. However, a solution having an electrolyte concentration of 1 to 80% by weight; a liquid temperature of 5° to 70° C.; a current density of 5 to 60 A/$dm^2$; a voltage of 1 to 100 V; and an electrolysis time of 10 seconds to 5 minutes are generally suitable.

When an amount of an anodic oxide film is less than 1.0 g/$m^2$, durability is not sufficient, scratches are easily made on the non-image area of planographic printing plate, and thus ink tends to attach to the scratched area on printing; namely, "scratch-stains" are easily caused.

After anodizing treatment, the surface of aluminum is, if necessary, subjected to a treatment for increasing hydrophilicity. As a hydrophilicity treatment as used in the first embodiment, there exists Alkaline Metal Silicate method (in which for example, an aqueous solution of sodium silicate is used), which is disclosed in U.S. Pat. Nos. 2,714,066; 3,181,461; 3,280,734; and 3,902,734. In this method, a substrate is immersed into an aqueous solution of sodium silicate, or electrolyzed therein. In addition, a method of treating with potassium zirconate fluoride as disclosed in JP-B No. 36-22063; and a method of treating with poly (vinyl phosphonic acid) as disclosed in U.S. Pat. Nos. 3,276,868, 4,153,461, and 4,689,272; or the like may be used.

A planographic printing plate of the present invention is the one in which a positive type photosensitive layer including a photosensitive composition of the present invention is provided on its substrate. However, if necessary, an under coat can be provided between the substrate and the photosensitive layer.

As a component of the under coat, various organic compounds are used. The component is selected from the group consisting of carboxymethyl cellulose; dextrin; gum arabic; a phosphonic acid having amino group, such as 2-aminoethylphosphonic acid; an organic phosphonic acid which may have a substituent(s), such as phenylphosphonic acid, naphthylphosphonic acid, alkylphosphonic acid, glycerophosphonic acid, methylenediphosphonic acid, or ethylenediphosphonic acid; an organic phosphoric acid which may have a substituent(s), such as phenylphosphoric acid, naphthylphosphoric acid, alkylphosphoric acid, or glycerophosphoric acid; an organic phosphinic acid which may have a substituent(s), such as phenylphosphinic acid, naphthylphosphinic acid, alkylphosphinic acid, or glycerophosphinic acid; an amino acid such as glycine, β-alanine; an amine hydrochloride having hydroxy group, such as triethanolamine hydrochloride; and the like, and may be used as a mixture of two or more thereof.

The organic under coat can be provided according to the following methods: amethodof providing the organic under coat, comprising the steps of: dissolving the organic compound mentioned above in an organic solvent such as methanol, ethanol or methyl ethyl ketone, or water, or a mixed solvent thereof, applying the solution onto an aluminum plate, and drying the same; and a method of providing the organic under coat, comprising the steps of: dissolving the organic compound mentioned above in an organic solvent such as methanol, ethanol or methyl ethyl ketone, or water, or a mixed solvent thereof, immersing an aluminum plate into the solution such that the aluminum plate adsorbs the compound above thereon, and thereafter washing the same with water or the like, and drying the same. In the former method, a solution including the organic compound described above in a concentration of 0.005 to 10% by weight can be applied according to various manners, while in the latter method, a solution having a concentration of 0.01 to 20% by weight, preferably 0.05 to 5% by weight; an immersion temperature of 20 to 90° C., preferably 25 to 50° C.; an immersion time of 0.1 second to 20 minutes, preferably 2 seconds to 1 minute can be employed. A solution used in these methods can be adjusted to a pH of 1 to 12 with a basic material such as ammonia, triethylamine, potassium hydroxide, and/or an acidic material such as hydrochloric acid or phosphoric acid. Furthermore, a yellow dye can be added thereto so as to improve the tone reproducibility of an image recording material.

The amount to be applied of the organic under coat is suitably 2 to 200 mg/$m^2$, preferably 5 to 100 mg/$m^2$. When the applied amount is less than 2 mg/$m^2$, plate wear performance can not be sufficiently provided. When the applied amount is more than 200 mg/$m^2$, the results are not satisfactory, either.

A positive type planographic printing plate as produced as mentioned above is usually subjected to an image exposure and developing treatment.

As a source for active light used for the image exposure, a solid-state laser and a semiconductor laser which can radiate infrared rays having wave length of 760 to 1200 nm can be enumerated.

In this embodiment, a light source having an emission wave length between a near-infrared area to an infrared area is preferred, and accordingly, a solid-state laser and a semiconductor laser is in particular preferred.

As a developing solution and a replenisher for a planographic printing plate of the first embodiment, an alkaline aqueous solution as conventionally known can be used, and inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide can be enumerated. Besides, organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine can be also used.

Each of these alkaline agents is used by alone, or as a mixture of two or more thereof.

Particularly preferred developing solutions among these alkaline agents are an aqueous solution of a silicate such as sodium silicate or potassium silicate, because developing properties can be adjusted by a ratio of silicon oxide $SiO_2$ which is one of components of the silicates to an alkaline metal oxide $M_20$ and each concentration thereof. For example, an alkaline metal silicate as disclosed in JP-A No. 54-62004 or JP-B No. 57-7427 is effectively used.

Additionally, when development is carried out by using an automatic processor, it is known that an aqueous solution (namely, a replenisher) having an alkaline strength higher than that of a developing solution is added thereto, and thereby a lot of PS plates can be treated without changing the developing solution in a developing tank for a long period of time. In an embodiment of the present invention also, this replenisher system is preferably applied. In order to conduct the acceleration and control of developing properties, and enhance the diffusion of residuals generated during development and the affinity of the PS plates with ink at a printing image area, various surfactants and/or organic solvents can be added to the developing solution and the replenisher if necessary. As preferable surfactants, anionic, cationic, nonionic and amphoteric surfactants can be enumerated.

Furthermore, if necessary, a reducing agent such as hydroquinone; resorcin; a sodium salt or potassium salt of an inorganic acid such as sulfurous acid or hydrogensulfurous acid; an organic carboxylic acid; a defoaming agent; a water softener can be added to the developing solution and the replenisher.

A printing plate which was developed by using the developing solution and the replenisher above is post-treated with washing water; a rising solvent including a surfactant or the like; and a desensitizing liquid including gum arabic and/or a starch derivative. As post-treatment when an image recording material in an embodiment of the present invention is used as a printing plate, various combinations of the treatments above can be employed.

Recently, in the industry of plate making or printing, for the purpose of rationalization and standardization of printing work, an automatic (developing) processor is broadly used for printing plates. Such an automatic processor commonly comprises a processing portion and a post-treating portion. More specifically, an automatic processor comprises an apparatus for conveying a printing plate, processing liquid tanks and a spraying apparatus, in which processor an exposed printing plate is horizontally conveyed, and each treating liquid, as it is pumped up, is sprayed from a spray nozzle so as to effect the developing process. In addition, in recent years, a method in which a printing plate is immersed in the processing liquids charged in the processing liquids tanks and transferred in the processing liquids by guide rolls is also known. According to such an automatic processing, it is possible to add a replenisher to each processing liquid, depending upon a processing amount, operating hours and the like.

Additionally, a method of processing with a substantially fresh processing liquid, that is, an expendable system can be also applied.

A photosensitive planographic printing plate in which a photosensitive composition of the first embodiment is used will be explained. When there exists an unnecessary image area (for example, the print of a film edge of original image film, and the like) on the planographic printing plate which has been subjected to image exposure, development, water washing and/or rinsing and/or gumming, the unnecessary image area is to be erased. In order to erase the unnecessary image, for example, a method comprising the steps of applying an erasing liquid to the unnecessary image area, leaving the same as it is for a predetermined period of time, and thereafter water washing the same is preferably used, as disclosed in JP-B No. 2-13293. Besides, a method comprising the steps of: illuminating an active light introduced through an optical fiber onto the unnecessary image area; and thereafter developing can be also utilized, as disclosed in JP-A No. 59-174842.

To the planographic printing plate as obtained as mentioned above, a desensitizing gum can be coated if desired, and thereafter the planographic printing plate is subjected to printing step. However, when a planographic printing plate having a higher plate wear is desired, a burning treatment is applied thereto.

When a planographic printing plate is subjected to a burning treatment, it is preferred to treat it with a counter-etching liquid as disclosed in each of JP-B Nos. 61-2518 and 55-28062, and JP-A Nos. 62-31859 and 61-159655, prior to the burning treatment.

As a method therefor, a method of applying the counter-etching liquid onto the planographic printing plate by using a sponge or an absorbent cotton into which the counter-etching liquid is impregnated, or immersing the planographic printing plate into a butt which is filled with the counter-etching liquid; or a method of coating by using an automatic coater is applied. Additionally, by homogenizing the applied amount by using a squeegee or a squeegee roller after applying or coating, more preferable results are provided.

The applied amount of the counter-etching liquid is commonly and suitably 0.03 to 0.8 $g/m^2$ (as dry weight).

The planographic printing plate to which the counter-etching liquid is applied is dried if necessary, and thereafter heated at an elevated temperature by using a burning processor (for example, a burning processor "BP-1300" as sold by Fuji Photo Film Co., Ltd.), wherein the heat temperature is preferably in the range of 180° to 300° C., and the heat time is in the range of 1 to 20 minutes, depending upon the type of components forming an image.

The planographic printing plate as burning-treated can be, if necessary, subjected to treatments such as water-washing and gumming, which are conventionally carried out. However, when a counter-etching liquid including awater-soluble polymer compound is used, gumming and the like, that is, a desensitizing treatment can be omitted.

The planographic printing plate as provided by treatments mentioned above is subjected to an offset press or the like so as to use for a lot of printing.

EXAMPLES

Hereinafter, the first embodiment will be exemplified according to Examples. However, the scope of the first embodiment is not intended to be limited by the Examples.

Examples 1 to 4

[Preparation of Substrates]

An aluminum plate (Material: 1050) having a thickness of 0.3 mm was washed and degreased with trichloroethylene, and thereafter this surface was subjected to graining by using a nylon brush and a 400 mesh pumice/water suspension, and then cleanly washed with water. This plate was immersed into an aqueous solution of 25% of sodium hydroxide at a temperature of 45° C. for a period of 9 seconds so as to etch the plate. After washing with water, the plate was furthermore immersed into a 20% nitrous acid for a period of 20 seconds, and water-washed, so that the etched amount on the surface by graining was about 3 $g/m^2$. Next, this plate was anodized by a direct current at a current density of 15 $A/dm^2$ using a 7% sulfuric acid as an electrolyte so as to form an anodized film thereupon in an amount of 3 $g/m^2$, and thereafter water-washed, and dried so as to obtain substrates A. The following primer coating liquid was applied to the substrates A, and the consequent films were dried at a temperature of 90° C. for a period of one minute so as to obtain substrates B. The applied amount of the films after drying was 10 $mg/m^2$.

| <Composition of Primer Coating Liquid> | |
|---|---|
| β-alanine | 0.5 g |
| Methanol | 95 g |
| Water | 5 g |

The following photosensitive liquids 1 in which infrared absorbing agents are varied as shown in the following Table 1 were prepared, and each of the photosensitive liquids 1 was applied to the resultant substrate above so as to obtain an applied amount of 1.8 g/$m^2$, and thus planographic printing plates for Examples 1 to 4 were provided.

| <Composition of Photosensitive Liquids 1> | |
|---|---|
| m, p-cresolnovolak (m/p ratio = 6/4; weight average molecular weight = 3500; with 0.5% by weight of non-reacted cresol) (alkaline water soluble polymer compound) | 1.0 g |
| Infrared absorbing agents as described in Table 1 (compounds represented by the general formula (I)) | 0.2 g |
| Dye in which a counter anion of victoria-pure-blue BOH is replaced with 1-naphthalenesulfonic acid anion | 0.02 g |
| Fluorine-contained surfactant (MEGAFAC F-177; manufactured by DAINIPPON INK AND CHEMICALS, INC.) | 0.05 g |
| γ-Butyrolactone | 3 g |
| Methylethyl ketone | 8 g |
| 1-Methoxy-2-propanol | 7 g |

Comparative Example 1

A planographic printing plate in Comparative Example 1 was prepared in the substantially same manner as the one in Example 1, except that infrared absorbing agents as represented by the general formula (I) as incorporated into photosensitive liquids 1 were replaced with an infrared absorbing agent B-1 as represented by the following structure.

B-1

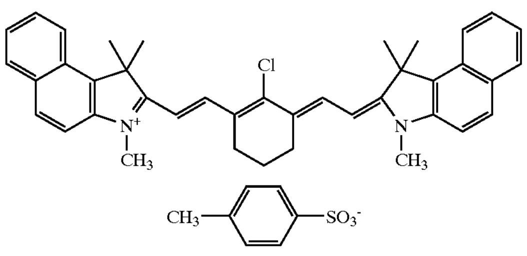

Examples 5 to 8

<Example of Synthesis (Copolymer 1)>

31.0 g (0.36 moles) of methacrylic acid, 39.1 g (0.36 moles) of ethyl chloroformate and 200 ml of acetonitrile were introduced into a three neck flask of 500 ml as provided with a stirrer, a condenser tube and a dropping funnel, and the mixture was stirred, while the mixture was cooled on an ice bath. Into the mixture, 36.4 g (0.36 moles) of triethylamine was dropped through the dropping funnel over about one hour. After the dropping was finished, the ice bath was removed, and the mixture was stirred at a room temperature for a period of 30 minutes.

To this reactant mixture, 51.7 g (0.30 moles) of p-aminobenzensulfonamide was added, and the mixture was stirred for a period of one hour, while heating at a temperature of 70° C. with an oil bath. After the reaction was finished, this mixture was added to one liter of water, while the water was stirred, and the consequent mixture was stirred for a period of 30 minutes. The mixture was filtrated to separate a deposit, this deposit was slurried with 500 ml of water, and thereafter this slurry was filtrated, and the consequent solids were dried so as to obtain a white solid of N-(p-aminosulfonylphenyl) methacrylamide (with a yield of 46.9 g).

Next, 4.61 g (0.0192 moles) of N-(p-aminosulfonylphenyl)methacrylamide, 2.94 g (0.0258 moles) of ethyl methacrylate, 0.80 g (0.015 moles) of acrylonitrile and 20 g of N,N-dimethylacetamide were introduced into a three neck flask of 20 ml as provided with a stirrer, a condenser tube and a dropping funnel, and the mixture was stirred, while the mixture was heated at a temperature of 65° C. on a hot water bath. Into the mixture, 0.15 g of "V-65" (manufactured by Wako Pure Chemical Industries, Ltd.) was added, and the mixture was stirred for 2 hours under a nitrogen flow, while a temperature of 65° C. was maintained. To this reactant mixture, a blend of 4.61 g of N-(p-aminosulfonylphenyl)methacrylamide, 2.94 g of ethyl methacrylate, 0.80 g of acrylonitrile, N,N-dimethylacetamide and 0.15 g of "V-65" was dropped through the dropping funnel over two hours. After the dropping was finished, the consequent mixture was furthermore stirred at a temperature of 65° C. for a period of two hours. After the reaction was finished, 40 g of methanol was added to the mixture, cooled, and the consequent mixture was added to 2 liters of water, while the water was stirred. After the mixture was stirred for a period of 30 minutes, a deposit was filtered out, separated and dried so as to obtain 15 g of a white solid. A gel permeation chromatography was used to determine of the weight average molecular weight (on the basis of polystyrene) of this copolymer 1. As a result, the weight average molecular weight was 53,000.

The following photosensitive liquids 2 in which infrared absorbing agents are varied as shown in the following Table 1 were prepared, and each of the photosensitive liquids 2 was applied to the same substrate as the one used in Examples 1 to 4, so that an applied amount was 1.8 g/$m^2$. Accordingly, planographic printing plates for Examples 5 to 8 were provided.

| <Composition of Photosensitive Liquids 2> | |
|---|---|
| The above-mentioned copolymer 1 (alkaline water soluble polymer compound) | 0.75 g |
| m, p-cresolnovolak (m/p ratio = 6/4; weight average molecular weight = 3500; with 0.5% by weight of non-reacted cresol) (alkaline water soluble polymer compound) | 0.25 g |
| Tetrahydrophthalic anhydride | 0.03 g |
| Infrared absorbing agents as described in Table 1 (compounds represented by the general formula (I)) | 0.017 g |
| Dye in which a counter anion of victoria-pure-blue BOH is replaced with 1-naphthalenesulfonic acid anion | 0.015 g |
| Fluorine-contained surfactant (MEGAFAC F-177; manufactured by DAINIPPON INK AND CHEMICALS, INC.) | 0.05 g |

-continued

| <Composition of Photosensitive Liquids 2> | |
|---|---|
| γ-Butyrolactone | 10 g |
| Methylethyl ketone | 10 g |
| 1-Methoxy-2-propanol | 1 g |

Comparative Example 2

A planographic printing plate in Comparative Example 2 was prepared in the substantially same manner as the one in Example 5, except that infrared absorbing agents as represented by the general formula (I) as incorporated into photosensitive liquids 2 were replaced with an infrared absorbing agent B-1 represented by the above-mentioned structure.

[Performance Evaluation of Planographic Printing Plate]

On each of the planographic printing plates in Examples 1 to 8 and Comparative Examples 1 and 2, which were produced as mentioned above, performance evaluation was made according to the following criteria. The results of evaluation are shown in Table 1.

Image Forming Properties: Evaluation of Sensitivity and Development Latitude The obtained planographic printing plates were exposed by using a semiconductor laser having a wave length of 840 nm, and developed by using an automatic processor (manufactured by Fuji Photo Film Co., Ltd. "PS processor 900VR") in which developing solution DP-4 and rinse liquid FR-3 (1:7) manufactured by Fuji Photo Film Co., Ltd. were charged, wherein DP-4 was used at dilution ratios of two levels of 1:6 and 1:12. The width of line at a non-image area as obtained with each developing solution was determined, and a radiation energy of a laser corresponding to the line width was determined, which was used as sensitivity. Then, differences between what was diluted at a ratio of 1:6 which is the standard and what was diluted at a ratio of 1:12 were recorded. The smaller the differences are, the better the development latitude is, and the value of 20 $mJ/cm^2$ or less represents a practicable level.

Evaluation of Preservation Stability

The consequent planographic printing plates were preserved at a temperature of 60° C. for a period of 3 days prior to the exposure to a laser, and thereafter a laser exposure and a development were carried out in the same manner as the one mentioned above, and a sensitivity was determined in the same manner so as to compare with the results as mentioned above. When the fluctuation of sensitivity is 20 $mJ/cm^2$ or less, preservation stability was evaluated to be excellent and to be on a practically acceptable level (which is a level which does not present any problems in actual practice).

TABLE 1

| | Infrared Absorbing Agent | Sensitivity ($mJ \cdot cm^2$) | Development Latitude ($mJ \cdot cm^2$) | Preservation Stability |
|---|---|---|---|---|
| Example 1 | IR-2 | 125 | 10 | Good |
| Example 2 | IR-7 | 120 | 15 | Good |
| Example 3 | IR-12 | 120 | 15 | Good |
| Example 4 | IR-22 | 125 | 10 | Good |

TABLE 1-continued

| | Infrared Absorbing Agent | Sensitivity ($mJ \cdot cm^2$) | Development Latitude ($mJ \cdot cm^2$) | Preservation Stability |
|---|---|---|---|---|
| Comparative example 1 | B-1 | 145 | 25 | Bad |
| Example 5 | IR-2 | 115 | 5 | Good |
| Example 6 | IR-7 | 115 | 10 | Good |
| Example 7 | IR-12 | 110 | 10 | Good |
| Example 8 | IR-22 | 115 | 5 | Good |
| Comparative example 2 | B-1 | 135 | 25 | Bad |

From the results shown in Table 1, it is found that, as compared with planographic printing plates in Comparative Examples 1 and 2 in which an infrared absorbing agent B-1 not having at the N-position a long-chain alkyl group is used, each of planographic printing plates in Examples 1 to 10 is high in sensitivity to an infrared laser. Furthermore, in each of planographic printing plates of Examples 1 to 10, a difference in sensitivity between two developing solutions having a different diluted concentration is 20 $mJ/cm^2$ or less which is practically acceptable level, and thus it has been confirmed that these planographic printing plates are excellent in developing latitude.

Besides, from the results of evaluation of preservation stability, it has been confirmed that, in all of the planographic printing plates of the first embodiment, a fluctuation in the sensitivity between before and after preservation is 20 $mJ/cm^2$ or less which is practically acceptable level. Therefore, the planographic printing plates of embodiments of the present invention are evaluated to be also excellent in preservation stability.

Examples 9 to 12

The substrate A used in Example 5 was treated with an aqueous solution of 2.5% by weight of sodium silicate at a temperature of 30° C. for a period of 10 seconds, and coated with the following primer coating liquid, and the film was dried at a temperature of 90° C. for a period of one minute so as to obtain a substrate C. The applied amount of the film after drying was 15 $mg/M^2$.

| <Composition of Primer Coating Liquid> | |
|---|---|
| Following copolymer having a molecular weight of 28000 | 0.3 g |
| Methanol | 100 g |
| Water | 1 g |

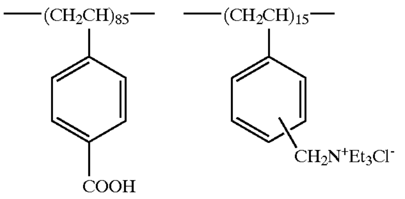

Molecular Weight 28,000

The same photosensitive liquids 2 as the ones used in Examples 5 to 8 were applied to the obtained substrates C so that an applied amount was 1.8 $g/m^2$, to obtain planographic printing plates for Examples 9 to 12.

Comparative Example 3

A planographic printing plate in Comparative Example 3 was prepared in the substantially same manner as the one in Example 9, except that infrared absorbing agents as represented by the general formula (I) as incorporated into photosensitive liquids 1 were replaced with an infrared absorbing agent B-1 as represented by the above-mentioned structure.

Each of the obtained planographic printing plates in Examples 9 to 12 and Comparative Example 3 was exposed at a main scanning speed of 5 m/second by using a semiconductor laser having an output of 500 mW, a wave length of 830 nm and a beam diameter of 17 $\mu$m (1/$e^2$), and thereafter developed by using an automatic processor "PS processor 900VR" (manufactured by Fuji Photo Film Co., Ltd.) into which two developing solutions (namely, a developing solution 1 and a developing solution 2) each having a different dilution ratio and the composition as shown below; and a rinsing liquid FR-3 (which is diluted at a ratio of 1:7) were charged. Then sensitivities and development latitudes thereof were recorded. Furthermore, the evaluation of preservation stability was made in the same manner as the one in Examples 1 to 8.

The results are shown in Table 2.

TABLE 2

| <Developing Solution 1> | |
|---|---|
| D-sorbitol | 5.1 parts by weight |
| Sodium hydroxide | 1.1 parts by weight |
| Triethanolamine, ethylene oxide additives (30 moles) | 0.03 parts by weight |
| Water | 93.9 parts by weight |
| **<Developing Solution 2>** | |
| D-sorbitol | 5.1 parts by weight |
| Sodium hydroxide | 1.1 parts by weight |
| Triethanolamine, ethylene oxide additives (30 moles) | 0.03 parts by weight |
| Water | 140.7 parts by weight |

| | Infrared Absorbing Agent | Sensitivity (mJ · $cm^2$) | Development Latitude (mJ · $cm^2$) | Preservation Stability |
|---|---|---|---|---|
| Example 9 | IR-2 | 120 | 10 | Good |
| Example 10 | IR-7 | 115 | 10 | Good |
| Example 11 | IR-12 | 115 | 10 | Good |
| Example 12 | IR-22 | 110 | 5 | Good |
| Comparative example 3 | B-1 | 140 | 20 | Slightly Bad |

From the results shown in Table 2, it is found that, as compared with a planographic printing plate in Comparative Example 3 in which an infrared absorbing agent B-1 not having at the N-position a long-chain alkyl group is used, each of planographic printing plates in Examples 9 to 12 is high in sensitivity to an infrared laser. Furthermore, even if a non-silicate developing solution was used, a difference in sensitivity between two developing solutions having a different diluted concentration (from each other) is 20 mJ/$cm^2$ or less which is practically acceptable level, and thus it has been confirmed that the planographic printing plates are excellent in developing latitude.

Besides, from the results of evaluation of preservation stability, it has been confirmed that, in all of the planographic printing plates of the first embodiment, a fluctuation in the sensitivity between before and after preservation is 20 mJ/$cm^2$ or less which is practically acceptable level. Therefore, the planographic printing plates of the first embodiment are evaluated to be excellent in preservation stability also.

From each of Examples mentioned above, it has been found that, when the above-mentioned specific infrared absorbing agent according to the first embodiment is used, a photosensitive composition is provided, which is highly sensitive and excellent in the stability of sensitivity when used (namely, excellent in development latitude) and furthermore is excellent in preservation stability.

Besides, according to a planographic printing plate in which this photosensitive composition is used, a direct plate making by using an infrared laser can be carried out, which is highly sensitive, and is excellent in development latitude and preservation stability.

As mentioned above, after all, a photosensitive composition of the first embodiment is wide in development latitude, and is excellent in image forming properties, and even after the photosensitive composition was reserved for a long period of time, the image forming properties are not decreased, and thus it is good in preservation stability. Furthermore, the planographic printing plate in which this photosensitive composition is used is a positive type of planographic printing plate for direct plate making which can form an image through an infrared laser, and thus can provide the effect of being excellent in image-forming properties and preservation stability.

Second Embodiment

Next, a second embodiment of the present invention will be explained in detail.

[Infrared Absorbing Agent(C) Represented by General Formula (II)]

An infrared absorbing agent represented by the above-mentioned general formula (II) can remarkably lower solubility to an alkaline developing solution at an image area by the interaction with the above-mentioned polymer compound (b) which is insoluble in water and soluble in an alkaline water. On the other hand, at a non-image area, as alkaline solubility is recovered by the decomposition of an infrared absorbing agent alone represented by the above-mentioned general formula (II) and/or by the termination of an interaction due to heat generated by the absorption of near infrared, an excellent discrimination for an image formation is expressed.

An infrared absorbing agent represented by the above-mentioned general formula (II) will be more particularly explained.

In the general formula (II), each of $X^1$ and $X^2$ independently represents —$CR^8R^9$—, —S—, —Se—, —$NR^{10}$—, —CH=CH— or —O—, wherein each of $R^8$ and $R^9$ represents an alkyl group having 1 to 18 carbon atoms, a substituted alkyl group having 1 to 18 carbon atoms, an aryl group having 6 to 18 carbon atoms, or a substitutional aryl group having 6 to 18 carbon atoms.

"n" represents an integer number of 2 to 4.

Each of $R^1$ and $R^2$ independently represents an alkyl group having 1 to 18 carbon atoms, or a substituted alkyl group having 1 to 18 carbon atoms; $R^3$ represents a group selected from the group consisting of an alkyl group having 1 to 10 carbon atoms, an aryl group, a substitutional aryl group, a substituted alkyl group having 1 to 10 carbon atoms, and a heterocyclic group having 5 or 6 of carbon in the circle; each of $R^4$, $R^5$, $R^6$ and $R^7$ independently represents hydrogen, an alkyl group having 1 to 10 carbon atoms, or a substituted alkyl group having 1 to 10 carbon atoms, wherein $R^4$ and $R^5$, or $R^6$ and $R^7$ may be bound so as to represent a plurality of atoms necessary for forming an aliphatic 5-membered ring, an aliphatic 6-membered ring, an aromatic 6-membered ring, aromatic 10-membered ring, a substitutional aromatic 6-membered ring, or a substitutional aromatic 10-membered ring; $R^{10}$ represents an alkyl group having 1 to 18 carbon atoms, a substituted alkyl group having 1 to 18 carbon atoms, an aryl group having 6 to 18 carbon atoms, or a substitutional aryl group having 6 to 18 carbon atoms.

As an alkyl group for $R^1$ to $R^{10}$ mentioned above, a linear, chain-branching, and ring alkyl groups having 1 to 18 carbon atoms can be enumerated. Specifically, methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicocyl group, isopropyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group can be enumerated. Among others, a linear alkyl group having 1 to 12 carbon atoms, a branched alkyl group having 3 to 12 carbon atoms, and a cyclic alkyl group having 5 to 10 carbon atoms are more preferable.

When these alkyl groups have a substituent, as the substituent, a monovalent non-metallic atomic group, except hydrogen is used. As preferable examples, halogen atoms (—F, —Br, —Cl, —I), hydroxyl group, or the like can be enumerated. The examples of these substituent groups are the same as the substituent groups incorporated into an alkyl group, explained in the first embodiment, and thus an explanation therefor will be hereupon omitted.

Furthermore, specific examples of an alkyl group incorporated on the above-described substituent; specific examples of an aryl group; and specific examples of an alkenyl group are also the same as the ones explained in the first embodiment mentioned above, and thus an explanation therefor will be hereupon omitted.

On the other hand, as an alkylene group which constitutes a substituted alkyl group in combination with a substituent, the one in which any one of hydrogen atoms on the alkyl group having a carbon number of 1 to 18 is removed so as to form a divalent organic residue can be enumerated. Preferably, a linear alkylene group having 1 to 12 carbon atoms, a chain-branching alkylene group having 3 to 12 carbon atoms, and a cyclic alkylene group having 5 to 10 carbon atoms can be enumerated. As a preferred specific example of a substituted alkyl group which is obtained by combining the above substituent and the above alkylene group, chloromethyl group, bromomethyl group, 2-chloroethyl group or the like can be enumerated. The preferred concrete example of a substituted alkyl group which is obtained by combining these substituent groups and the alkylene groups is the same as those which were explained in the first embodiment, and thus an explanation thereof will be hereupon omitted.

As an aryl group in the above-mentioned $R^1$ to $R^{10}$, the one in which a condensed ring is formed from one to three benzene rings; and the one in which a condensed ring is formed from a benzene ring(s) and an unsaturated 5-membered ring(s) can be enumerated. As concrete examples, phenyl group, naphthyl group, anthryl group, phenanthryl group, indenyl group, acetabutenyl group, and fluorenyl group can be enumerated. Among others, phenyl group, and naphthyl group are preferred.

As substituent aryl groups, the one which has amonovalent non-metallic atomic group except hydrogen as a substituent on a ring-forming carbon atom of one of the above-mentioned aryl groups is used. As preferred examples of such substituent groups, the ones enumerated as the alkyl groups, the substituted alkyl groups, or the substituent groups in the substituted alkyl groups as mentioned above can be enumerated.

As preferred examples of such substitutional aryl groups, biphenyl group, tolyl group, xylyl group and the like can be enumerated. Incidentally, preferred examples of these substitutional aryl groups are the same as the ones explained in the first embodiment, and thus an explanation therefor will be hereupon omitted.

Q represents a counter ion having a molecular weight of 70 or more, preferably 79 to 500. When the molecular weight of a counter ion Q is less than 70, the probability of causing the following various problems becomes higher, and thus such a lowmolecular weight is not preferred: that the volatilization of an acid resulting from the decomposition of a colorants, the existence of impurities or the like is caused, and thereby the stability of an infrared absorbing agent itself is decreased; that the image-forming properties of a photosensitive material is deteriorated as time goes; that the organicitiy of the infrared absorbing agent itself is decreased and thereby the solubility to a coating liquid becomes insufficient; and that by the decreasing of the organicity, the affinity with an alkaline-water soluble polymer compound or the other compound in a photosensitive layer is decreased and the coagulation of a coloring occurs, thereby deteriorating the image-forming properties.

As the counter ions, the ones as represented by the general formula (III) are preferred, wherein A represents an atom selected from the group consisting of B, P, As, Sb, Cl and Br. From the viewpoint of ease in synthesis, and safety of the compound, B, P, Sb and Cl are preferred.

Y represents a halogen atom such as Cl, I, Br, F, or oxygen atom. Among others, from the viewpoint of ease in obtaining a raw material, Y is preferably fluorine or oxygen atom.

m represents an integer of 1 to 6, preferably 4 to 6.

Furthermore, as Q, the one having a sulfonic acid structure in its structure is also preferably used. No matter what structure Q has, it is required that the molecular weight of the counter ion Q alone is 70 or more.

Additionally, concrete examples of preferred counter ions (such as $ClO_4^-$, $BrO_{4-}$) in the second embodiment, and concrete examples of counter anions (such as methanesulfonate) having a sulfonic acid structure, which can be used as a counter ion Q in an infrared absorbing agent in the second embodiment are the same as the ones explained in the first embodiment, and thus an explanation therefor will be hereupon omitted.

Hereinafter, a process for preparing an infrared absorbing agent as represented by the general formula (II) mentioned above will be explained.

An infrared absorbing agent as represented by the above general formula (II) can be prepared according to a publicly known organic synthesis technology. As concrete synthetic processes, the ones disclosed in J. Org. Chem. (Journal of Organic Chemistry), Vol. 57 (No. 17), 1992, p.4578–4580; and Registered U.S. Pat. No. 2758136 can be enumerated.

Concrete examples of infrared absorbing agents as represented by the above general formula (II) are enumerated as follows. However, infrared absorbing agents in the second embodiment are not intended to be limited to these concrete examples.

-continued
IR-31
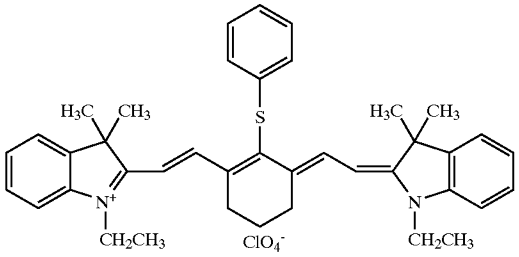
IR-32
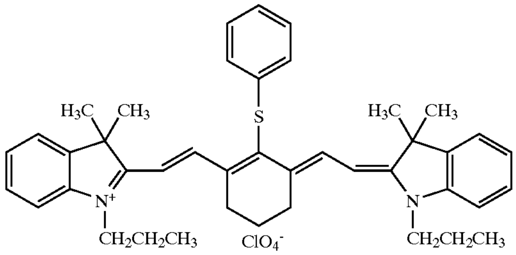
IR-33
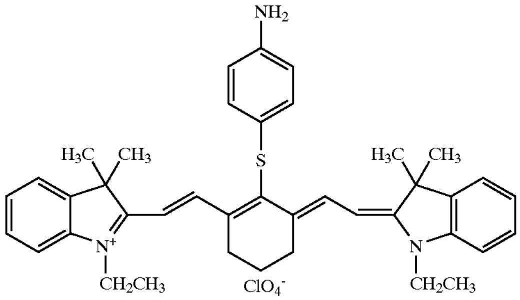
IR-34
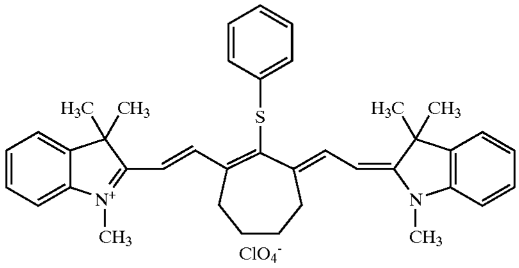
IR-35
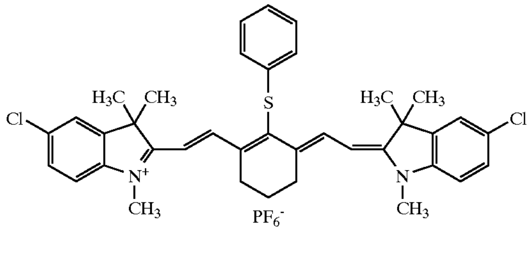
IR-36
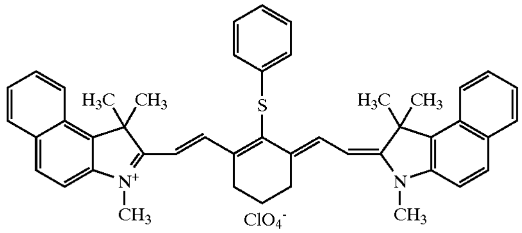
IR-37
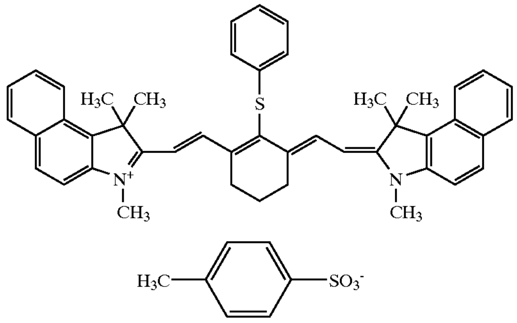
IR-38
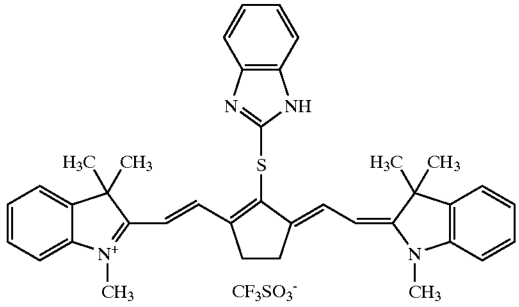
IR-39
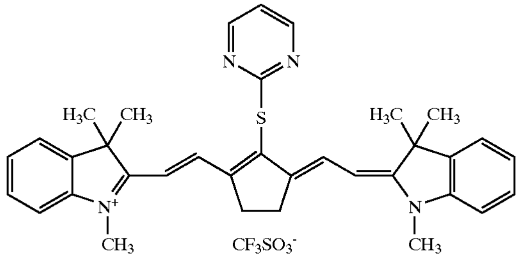
IR-40
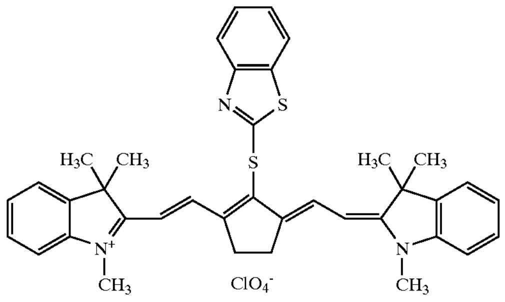

-continued
IR-41
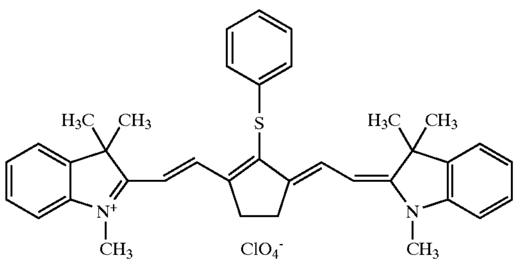
IR-42
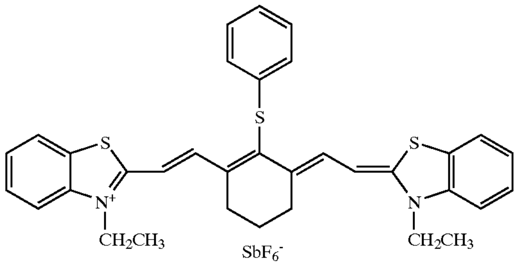
IR-43
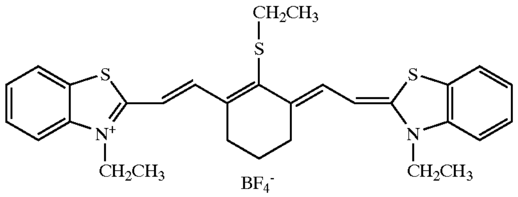
IR-44
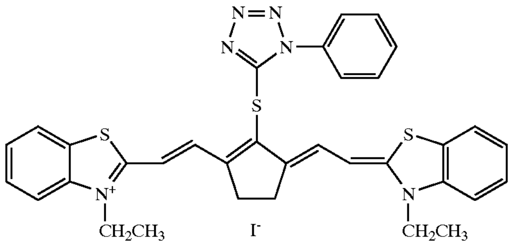
IR-45
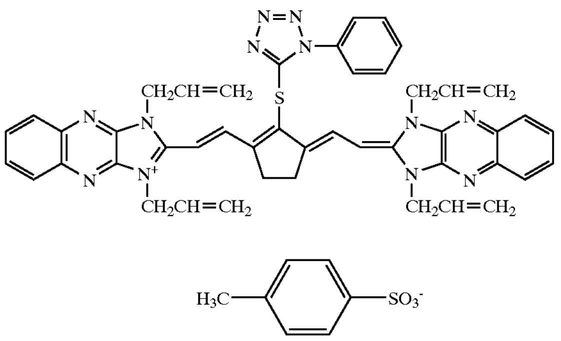
-continued
IR-46
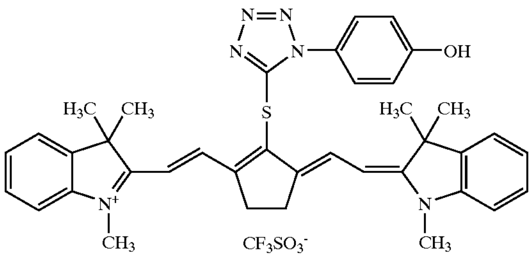
IR-47
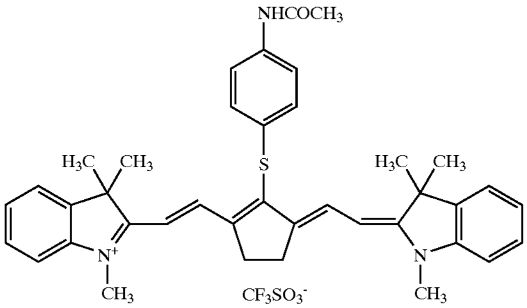
IR-48
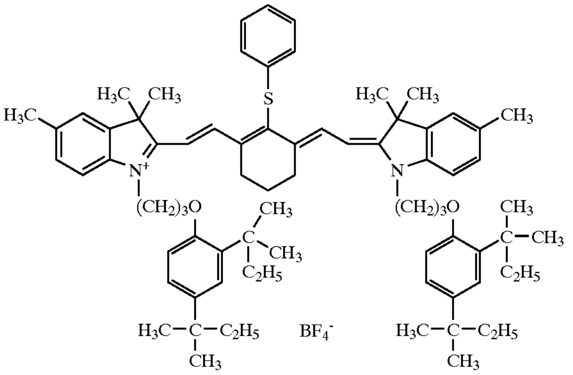
IR-49
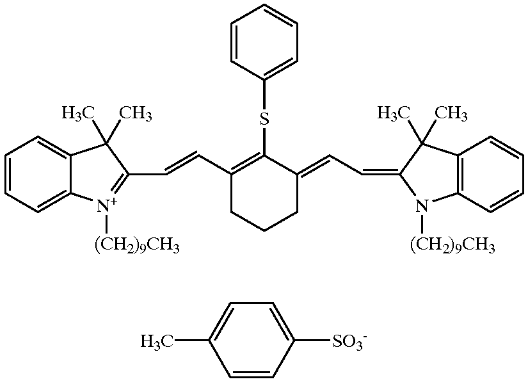

-continued
IR-50
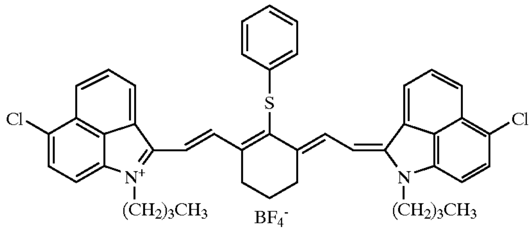
IR-51
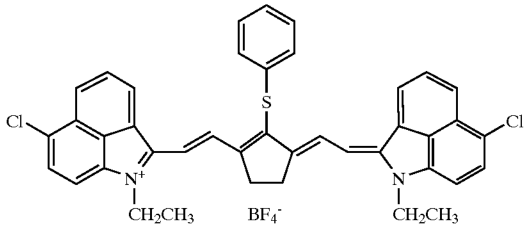
IR-52
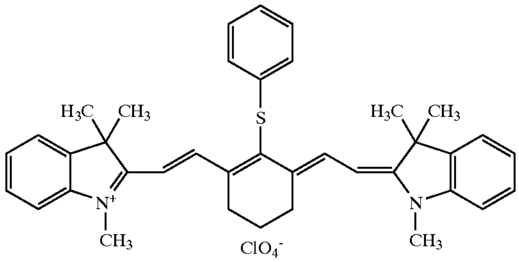
IR-53
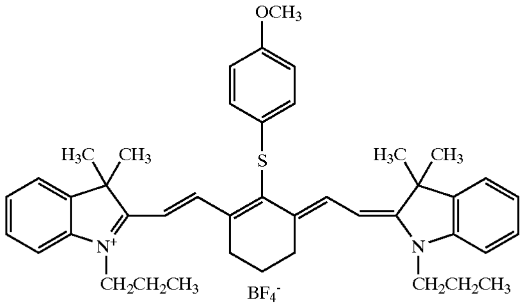
IR-54
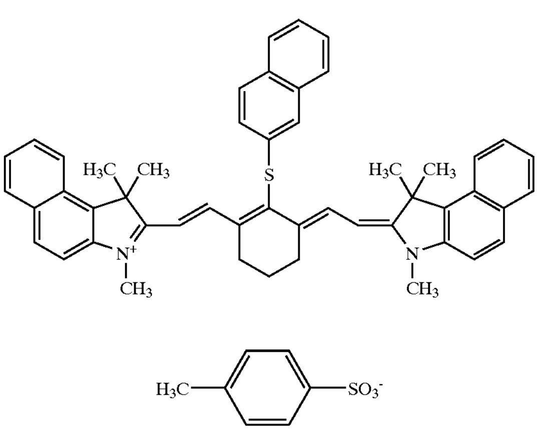
-continued
IR-55
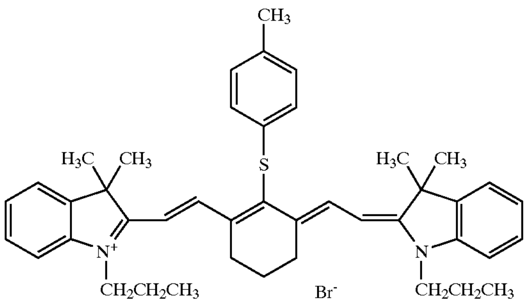
IR-56
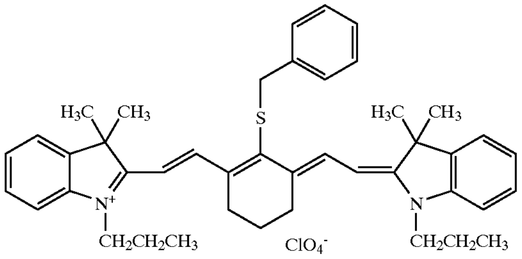
IR-57
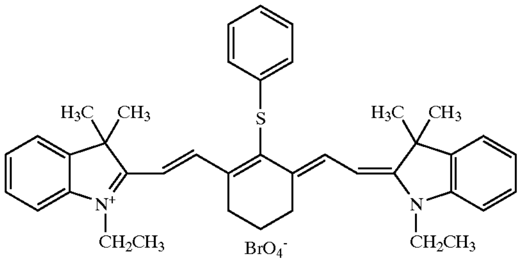
IR-58
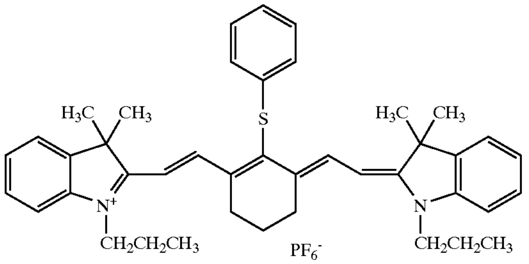
IR-59
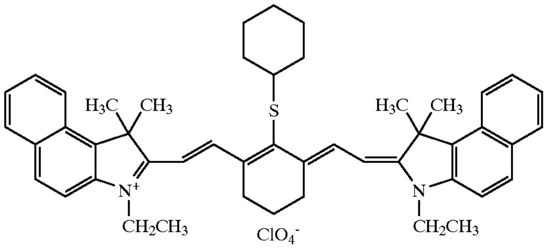

-continued

IR-60

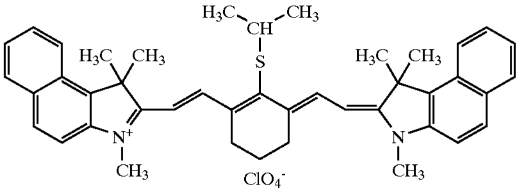

IR-61

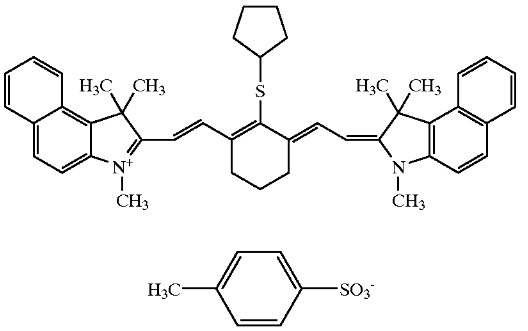

IR-62

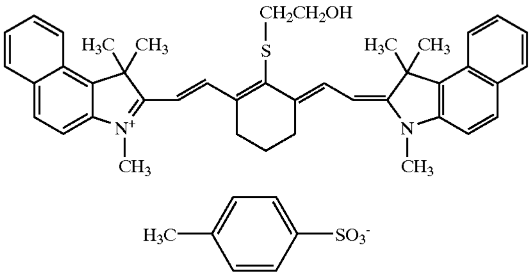

IR-63

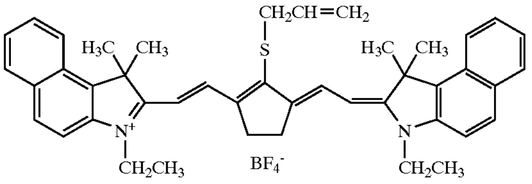

IR-64

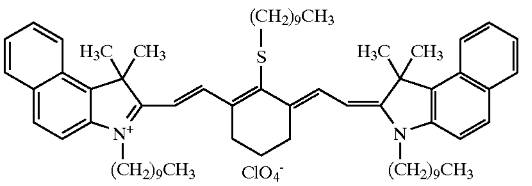

IR-65

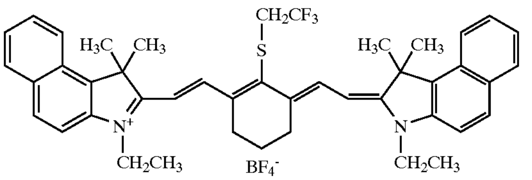

-continued

IR-66

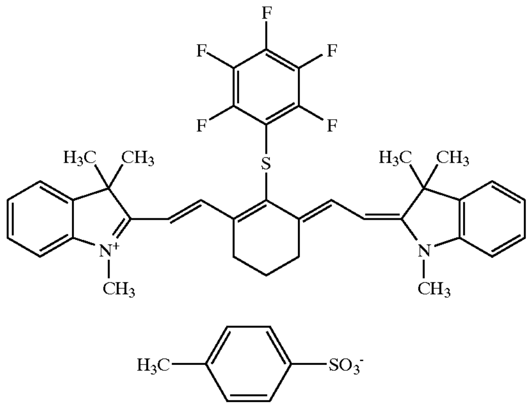

IR-67

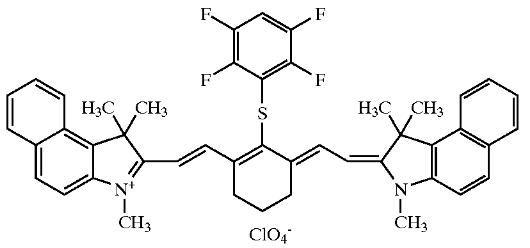

In the second embodiment, these infrared absorbing agents can be added thereto in a ratio of 0.01 to 50% by weight, preferably 0.1% to 20% by weight, more preferably 0.5% to 15% by weight to the whole solids of a photosensitive composition. When the added amount is less than 0.01% by weight, an image can not be formed by using the photosensitive composition. On the other hand, when the amount is more than 50% by weight and it is used as a photosensitive layer in a planographic printing plate, a stain may be caused at a non-image area.

To the photosensitive composition in the second embodiment, other pigments or dyes having infrared absorbing properties can be added as well as the present infrared absorbing agents, in order to improve image-forming properties.

As pigments, commercial pigments; and pigments disclosed in Color Index (C. I.) Handbook, "New Pigments Handbook" (Edit. by Japan Pigments Technical Society, 1977), "New Pigments Application Technology" (Pub. by CMC, 1986), and "Printing Ink Technology" (Pub. by CMC, 1984) are available.

Further, the types of pigments (such as a black pigment, a yellow pigment, an orange pigment, carbon black); the surface treatment of pigments; the particle sizes of pigments; method for dispersing pigments; examples of dyes; the manner of adding pigments and/or dyes; and the like are the same as the ones enumerated in the first embodiment mentioned before, and thus a detailed explanation thereon will be hereupon omitted.

Besides, with respect to aqueous alkaline solution soluble resins (polymer compounds) (b) as used in the second embodiment, the same aqueous alkaline solution soluble resins as the ones used in the first embodiment are wholly used, including characteristics such as preferred acid radicals, namely (b-1) phenolichydroxidegroup, (b-2) sulfoneamidegroup, and (b-3) active imide group.

Furthermore, in the same manner as the first embodiment, other components including an onium salt, a counter ion of the onium salt, a burning agent, an image coloring agent, a surfactant may be suitably added thereto. These components are the same as the ones explained in the first embodiment, and thus an explanation thereon will be hereupon omitted.

Besides, with respect to substrates used in the second embodiment, the constitution and a method of producing the same are the same as the ones explained in the first embodiment, and thus an explanation thereon will be hereupon omitted.

Furthermore, an image exposure, a developing treatment and the other treatments to a photosensitive planographic printing plate in which a photosensitive composition of the second embodiment is used are the same as the ones explained in the first embodiment, and thus an explanation thereon will be hereupon omitted.

Hereinafter, the second embodiment will be explained according to Examples. However, the scope of the second embodiment is not intended to be limited by these Examples.

Examples 1 to 4

[Preparation of Substrates]

An aluminum plate (Material: 1050) having a thickness of 0.3 mm was washed and degreased with trichloroethylene, and thereafter this surface was subjected to graining by using a nylon brush and a 400 mesh pumice/water suspension, and then cleanly washed with water. This plate was immersed into an aqueous solution of 25% of sodium hydroxide at a temperature of 45° C. for a period of 9 seconds so as to etch the plate. After water-washed, and the plate was furthermore immersed into a 20% nitrous acid for a period of 20 seconds, and water-washed, wherein the etched amount on the surface by graining was about 3 g/$m^2$. Then, this plate was anodized by a direct current at a current density of 15 A/$dm^2$ in an amount of 3 g/$m^2$ using a 7% sulfuric acid as an electrolyte so as to form an anodized film thereupon, and thereafter water-washed, and dried so as to obtain substrates A. The following primer coating liquid was applied to the substrates A, and the consequent films were dried at a temperature of 90° C. for a period of one minute so as to obtain substrates B. The applied amount of the films after drying was 10 mg/$m^2$.

| <Composition of Primer Coating Liquid> | |
|---|---|
| β-alanine | 0.5 g |
| Methanol | 95 g |
| Water | 5 g |

The following photosensitive liquids 1 in which infrared absorbing agents are varied as shown in the following Table 1 were prepared, and each of the photosensitive liquids 1 was applied to the resultant substrate above so as to obtain an applied amount of 1.8 g/$m^2$, and thus planographic printing plates for Examples 1 to 5 were provided.

| <Composition of Photosensitive Liquids 1> | |
|---|---|
| m, p-cresolnovolak (m/p ratio = 6/4; weight average molecular weight = 3500; with 0.5% by weight of non-reacted cresol) (alkaline water soluble polymer compound) | 1.0 g |

-continued

| <Composition of Photosensitive Liquids 1> | |
|---|---|
| Infrared absorbing agents as described in Table 3 (compounds represented by the general formula (II)) | 0.2 g |
| Dye in which a counter anion of victoria-pure-blue BOH is replaced with 1-naphthalenesulfonic acid anion | 0.02 g |
| Fluorine-contained surfactant (MEGAFAC F-177; manufactured by DAINIPPON INK AND CHEMICALS, INC.) | 0.05 g |
| γ-Butyrolactone | 3 g |
| Methylethyl ketone | 8 g |
| 1-Methoxy-2-propanol | 7 g |

Comparative Examples 1 to 2

Planographic printing plates in Comparative Examples 1 to 2 were prepared in the substantially same manner as the one in Example 1, except that infrared absorbing agents as represented by the general formula (II) incorporated into photosensitive liquids 1 were replaced with an infrared absorbing agent B-1 or B-2 as represented by the following structures.

B-1

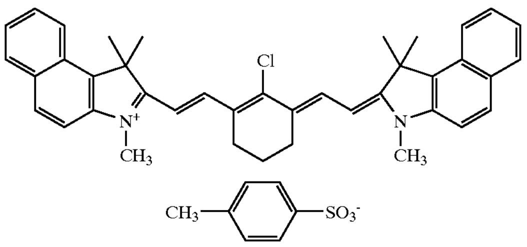

B-2

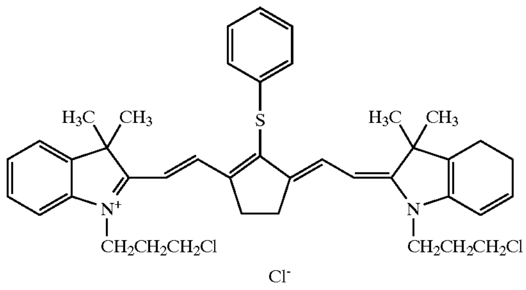

Examples 6 to 10

<Example of Synthesis (Copolymer 1)>

31.0 g (0.36 moles) of methacrylic acid, 39.1 g (0.36 moles) of ethyl chloroformate and 200 ml of acetonitrile were introduced into a three neck flask of 500 ml as provided with a stirrer, a condenser tube and a dropping funnel, and the mixture was stirred, while the mixture was cooled on an ice bath. Into the mixture, 36.4 g (0.36 moles) of triethylamine was the dropping was finished, the ice bath was removed, and the mixture was stirred at a room temperature for a period of 30 minutes.

To this reactant mixture, 51.7 g (0.30 moles) of p-aminobenzensulfonamide was added, and the mixture was stirred for a period of one hour, while heating at a temperature of 70° C. with an oil bath. After the reaction was finished, this mixture was added to one liter of water, while the water was stirred, and the consequent mixture was stirred for a period of 30 minutes. The mixture was filtrated to separate a deposit, this deposit was slurried with 500 ml of water, and thereafter this slurry was filtrated, and the obtained solids were dried so as to obtain a white solid of N-(p-aminosulfonylphenyl) methacrylamide (with a yield of 46.9 g).

Next, 4.61 g (0.0192 moles) of N-(p-aminosulfonylphenyl)methacrylamide, 2.94 g (0.0258 moles) of ethyl methacrylate, 0.80 g (0.015 moles) of acrylonitrile and 20 g of N,N-dimethylacetamide were introduced into a three neck flask of 20 ml as provided with a stirrer, a condenser tube and a dropping funnel, and the mixture was stirred, while the mixture was heated at a temperature of 65° C. on a hot water bath. Into the mixture, 0.15 g of "V-65" (manufactured by Wako Pure Chemical Industries, Ltd.) was added, and the mixture was stirred for 2 hours under a nitrogen flow, while a temperature of 65° C. was maintained. To this reactant mixture, a blend of 4.61 g of N-(p-aminosulfonylphenyl)methacrylamide, 2.94 g of ethyl methacrylate, 0.80 g of acrylonitrile, N,N-dimethylacetamide and 0.15 g of "V-65" was dropped through the dropping funnel over two hours. After the dropping was finished, the consequent mixture was furthermore stirred at a temperature of 65° C. for a period of two hours. After the reaction was finished, 40 g of methanol was added to the mixture, cooled, and the consequent mixture was added to 2 litters of water, while the water was stirred. After the mixture was stirred for a period of 30 minutes, a deposit was filtered out, separated and dried so as to obtain 15 g of a white solid. A gel permeation chromatography was used to determine of the weight average molecular weight (on the base of polystyrene) of this copolymer 1. As a result, the weight average molecular weight was 53,000.

The following photosensitive liquids 2 in which infrared absorbing agents are varied as shown in the following Table 3 were prepared, and each of the photosensitive liquids 2 was applied to the same substrate as the one used in Examples 1 to 4, so as to obtain an applied amount of 1.8 g/m$^2$, and thus planographic printing plates for Examples 6 to 10 were provided.

| <Composition of Photosensitive Liquids 2> | |
|---|---|
| The above-mentioned copolymer 1 (alkaline water soluble polymer compound) | 0.75 g |
| m, p-cresolnovolak (m/p ratio = 6/4; weight average molecular weight = 3500; with 0.5% by weight of non-reacted cresol) (alkaline water soluble polymer compound) | 0.25 g |
| Tetrahydrophthalic anhydride | 0.03 g |
| Infrared absorbing agents as described in Table 3 (compounds represented by the general formula (II)) | 0.017 g |
| Dye in which a counter anion of victoria-pure-blue BOH is converted into 1-naphthalenesulfonic acid anion | 0.015 g |
| Fluorine-contained surfactant (MEGAFAC F-177; manufactured by DAINIPPON INK AND CHEMICALS, INC.) | 0.05 g |
| γ-Butyrolactone | 10 g |
| Methylethyl ketone | 10 g |
| 1-Methoxy-2-propanol | 1 g |

Comparative Examples 3 and 4

Planographic printing plates in Comparative Examples 3 and 4 were prepared in the substantially same manner as the one in Example 6, except that infrared absorbing agents as represented by the general formula (II) incorporated into photosensitive liquids 2 were replaced with an infrared absorbing agent B-1 or B-2 as represented by the above-mentioned structure.

[Performance Evaluation of Planographic Printing Plate]

On each of the planographic printing plates in Examples 1 to 10 and Comparative Examples 1 to 4, which were produced as mentioned above, performance evaluation was made according to the following criteria. The results of evaluation are shown in Table 3.

Image Forming Properties: Evaluation of Sensitivity and Development Latitude

The consequent planographic printing plates were exposed by using a semiconductor laser having a wave length of 840 nm, and developed by using an automatic processor (manufactured by Fuji Photo Film Co., Ltd. "PS processor 900VR") in which developing solution DP-4 and rinse liquid FR-3 (1:7) (manufactured by Fuji Photo Film Co., Ltd.) were charged, wherein DP-4 was used at dilution ratios of two levels of 1:6 and 1:12. The width of line at a non-image area as obtained with each developing solution was determined, and a radiation energy of a laser corresponding to the line width was determined, which was used as sensitivity. Then, differences between what was diluted at a ratio of 1:6 which is the standard and what was diluted at a ratio of 1:12 were recorded. The smaller the differences are, the better the development latitude is, and the value of 20 mJ/cm$^2$ or less represents a practically acceptable level.

Evaluation of Preservation Stability

The consequent planographic printing plates were preserved at a temperature of 60° C. for a period of 3 days prior to the exposure to a laser, and thereafter a laser exposure and a development were carried out in the same manner as the one mentioned above, and a sensitivity was determined in the same manner so as to compare the new results with the aforementioned results. When the fluctuation of sensitivity is 20 mJ/cm$^2$ or less, preservation stability was evaluated to be excellent and less, preservation stability was evaluated to be excellent and to be on a practically acceptable level.

TABLE 3

| | Infrared Absorbing Agent | Sensitivity (mJ · cm$^2$) | Development Latitude (mJ · cm$^2$) | Preservation Stability |
|---|---|---|---|---|
| Example 1 | IR-32 | 125 | 10 | Good |
| Example 2 | IR-37 | 120 | 15 | Good |
| Example 3 | IR-44 | 125 | 15 | Good |
| Example 4 | IR-49 | 120 | 15 | Good |
| Example 5 | IR-55 | 120 | 10 | Good |
| Example 6 | IR-32 | 115 | 5 | Good |
| Example 7 | IR-37 | 115 | 10 | Good |
| Example 8 | IR-44 | 110 | 10 | Good |
| Example 9 | IR-49 | 115 | 5 | Good |
| Example 10 | IR-55 | 115 | 5 | Good |
| Comparative example 1 | B-1 | 145 | 25 | Bad |
| Comparative example 2 | B-2 | 140 | 20 | Bad a little |
| Comparative example 3 | B-1 | 135 | 25 | Bad |
| Comparative example 4 | 8-2 | 130 | 20 | Bad a little |

From the results shown in Table 3, it is found that, as compared with planographic printing plates in Comparative Examples 1 to 4 in which an infrared absorbing agent B-1 not having at the methyne chain an —S— connecting substituent, or an infrared absorbing agent B-2 having at the methyne chain an —S— connecting substituent but the molecular weight of a counter plates in Examples 1 to 10 is high in sensitivity to an infrared laser. Furthermore, in each of planographic printing plates of Examples 1 to 10, a difference in sensitivity between two developing solutions having a different diluted concentration from each other is 20 mJ/cm$^2$ or less which is practically acceptable level (which is a level which does not present any problems in actual practice). Accordingly, and thus it has been confirmed that the planographic printing plates are excellent in developing latitude.

Besides, from the results of evaluation of preservation stability, it has been confirmed that, in all of the planographic printing plates of the second embodiment, a fluctuation in the sensitivity between before and after preservation is 20 mJ/cm$^2$ or less which is a practically acceptable level. Therefore, the planographic printing plates of embodiments of the present invention were evaluated to be also excellent in preservation stability.

Examples 11 to 15

The substrate A used in Example 6 was treated with an aqueous solution of 2.5% by weight of sodium silicate at a temperature of 30° C. for a period of 10 seconds, and coated with the following primer coating liquid, and the film was dried at a temperature of 90° C. for a period of one minute so as to obtain a substrate C. The applied amount of the film layer after drying was 15 mg/m$^2$.

| <Composition of Primer Coating Liquid> | |
|---|---|
| Following copolymer having a molecular weight of 28000 | 0.3 g |
| Methanol | 100 g |
| Water | 1 g |

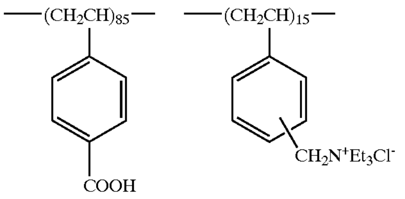

Molecular Weight 28,000

The same photosensitive liquids 1 as the ones used in the above-mentioned Examples 6 to 10 were applied to the consequent substrates C so that an applied amount was 1.8 g/m$^2$, to obtain planographic printing plates for Examples 11 to 15.

Each of the consequent planographic printing plates in Examples 10 to 15 was exposed at a main scanning speed of 5 m/second by using a semiconductor laser having an output of 500 mW, a wave length of 830 nm and a beam diameter of 17 μm (1/e$^2$) and thereafter developed by using an automatic processor "PS processor 900VR" (manufactured by Fuji Photo Film Co., Ltd.) into which two developing solutions (namely, a developing solution 1 and a developing solution 2) each having a different dilution ratio and the following composition as shown below and a rinsing liquid FR-3 (which is diluted at a ratio of 1:7) were charged. Then sensitivities and development latitudes thereof were recorded. Furthermore, the evaluation of preservation stability was made in the same manner as the one in Examples 1 to 10.

The results are shown in Table 4.

TABLE 4

| <Developing Solution 1> | |
|---|---|
| D-sorbitol | 5.1 parts by weight |
| Sodium hydroxide | 1.1 parts by weight |
| Triethanolamine, ethylene oxide additives (30 moles) | 0.03 parts by weight |
| Water | 93.9 parts by weight |
| **<Developing Solution 2>** | |
| D-sorbitol | 5.1 parts by weight |
| Sodium hydroxide | 1.1 parts by weight |
| Triethanolamine, ethylene oxide additives (30 moles) | 0.03 parts by weight |
| Water | 140.7 parts by weight |

| | Infrared Absorbing Agent | Sensitivity (mJ · cm$^2$) | Development Latitude (mJ · cm$^2$) | Preservation Stability |
|---|---|---|---|---|
| Example 11 | IR-32 | 120 | 10 | Good |
| Example 12 | IR-37 | 115 | 10 | Good |
| Example 13 | IR-44 | 110 | 10 | Good |
| Example 14 | IR-49 | 115 | 5 | Good |
| Example 15 | IR-55 | 115 | 10 | Good |
| Comparative example 5 | B-1 | 140 | 20 | Slightly Bad |
| Comparative example 6 | B-2 | 135 | 20 | Slightly Bad |

From the results shown in Table 4, it is found that, as Example 5 or 6 in which an infrared absorbing agent B-1 not having at the methyne chain an —S— connecting substituent, or an infrared absorbing agent B-2 having at the methyne chain an —S— connecting substituent but the molecular weight of a counter ion being less than 70 is used, each of planographic printing plates in Examples 11 to 15 is high in sensitivity to an infrared laser. Furthermore, even if a non-silicate developing solution was used, a difference in sensitivity between two developing solutions having a different diluted concentration is 20 mJ/cm$^2$ or less which is a practically acceptable level, and thus it has been confirmed that the planographic printing plates are excellent in developing latitude.

Besides, from the results of evaluation of preservation stability, it has been confirmed that, in all of the planographic printing plates of the second embodiment, a fluctuation in the sensitivity between before and after preservation is 20 mJ/cm$^2$ or less which is a practically acceptable level. Therefore, the planographic printing plates of the first embodiment are evaluated to be also excellent in preservation stability.

From each of Examples mentioned above, it has been found that when the above-mentioned specific infrared absorbing agent according to the second embodiment is used, a photosensitive composition can be provided, which is excellent in the stability of sensitivity when developing solutions of different concentrations are used (namely, excellent in development latitude) and furthermore is excellent in preservation stability.

Besides, according to a planographic printing plate in which this photosensitive composition is used, a direct plate making by using an infrared laser can be carried out, which is highly sensitive, and is excellent in development latitude and preservation stability.

As mentioned above, after all, a photosensitive composition of the present invention is wide in development latitude, and is excellent in image forming properties, and even after the photosensitive composition was reserved for a long period of time, the image forming properties are not decreased and thus it is good in preservation stability. Furthermore, the planographic printing plate in which this photosensitive composition is used is a positive type of planographic printing plate for direct plate making which can form an image through an infrared laser, and thus can provide the effect that it is excellent in image forming properties and preservation stability.

What is claimed is:

1. A photosensitive composition comprising:

(a) an infrared absorbing agent represented by the following formula (II); and (b) a polymer compound which is insoluble in water and soluble in an aqueous alkali solution, wherein;

the solubility of the photosensitive composition in an aqueous alkali solution is changed by radiation of an infrared laser;

(II)

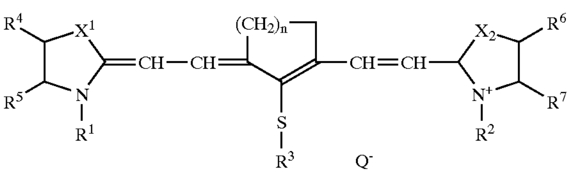

wherein $X^1$ and $X^2$ independently represent —$CR^8R^9$—, —S—, —Se—, —$NR^{10}$—, —CH═CH— or —O—, n denotes an integer of 2, 3 or 4, $R^1$ and $R^2$ independently represent an alkyl group having 1 to 18 carbon atoms, $R^3$ represents a group selected from the group consisting of an alkyl group having 1 to 10 carbon atoms, a substituted alkyl group having 1 to 10 carbon atoms, an aryl group, a substituted aryl group and a heterocyclic group having 5 to 6 carbon atoms in the ring, $R^4$, $R^5$, $R^6$ and $R^7$ independently represent a hydrogen atom, an alkyl group having 1 to 10 carbon atoms or a substituted alkyl group having 1 to 10 carbon atoms and may represent a plurality of atoms required for $R^4$ and $R^5$ or $R^6$ and $R^7$ to be combined with each other to form an aliphatic 5- or 6-membered ring, an aromatic 6-membered ring, an aromatic 10-membered ring, a substituted aromatic 6-membered ring or a substituted aromatic 10-membered ring, $R^8$ and $R^9$ independently represent an alkyl group having 1 to 18 carbon atoms, a substituted alkyl group having 1 to 18 carbon atoms, an aryl group having 6 to 18 carbon atoms or a substituted aryl group having 6 to 18 carbon atoms, $R^{10}$ represents an alkyl group having 1 to 18 carbon atoms, a substituted alkyl group having 1 to 18 carbon atoms, an aryl group having 6 to 18 carbon atoms or a substituted aryl group having 6 to 18 carbon atoms and Q represents a counter ion having a molecular weight of 70 or more.

2. A photosensitive composition according to claim 1, wherein the counter ion Q of the infrared absorbing agent represented by said formula (II) is represented by the following formula (III), $$[A—(Y)_m]^{\ominus} \qquad (III)$$

wherein A represents an atom selected from the group consisting of B, P, As, Sb, Cl and Br, Y represents a halogen atom or an oxygen atom and m denotes an integer from 1 to 6.

3. A photosensitive composition according to claim 2, wherein said counter ion Q has a molecular weight of 79 to 500.

4. A photosensitive composition according to claim 1, wherein the counter ion Q of the infrared absorbing agent represented by said formula (II) is a counter ion having a sulfonic acid structure.

5. A photosensitive composition according to claim 1, wherein said aqueous alkali solution-soluble polymer compound has an acid group structure on the principal chain or side chain thereof.

6. A photosensitive composition according to claim 5, wherein said acid group structure includes a phenolic hydroxyl group, a sulfoneamide group and an activated imide group.

7. A photosensitive composition according to claim 1, wherein the infrared absorbing agent is added in a proportion of 0.01 to 50% by weight based on the total solid of the photosensitive composition.

8. A planographic printing plate comprising disposing a photosensitive layer consisting of the photosensitive composition as claimed in claim 1 on a substrate.

9. A photosensitive composition comprising:

(a) an infrared absorbing agent represented by the following formula (II); and (b) a polymer compound which is insoluble in water and soluble in an aqueous alkali solution, wherein;

the solubility of the photosensitive composition in an aqueous alkali solution is changed by radiation of an infrared laser;

(II)

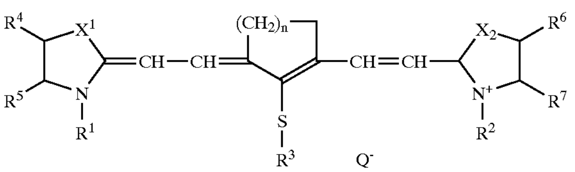

wherein $X^1$ and $X^2$ independently represent —$CR^8R^9$—, —S—, —Se—, —$NR^{10}$—, —CH═CH— or —O—, n denotes an integer of 2, 3 or 4, $R^1$ and $R^2$ independently represent an alkyl group having 1 to 18 carbon atoms or a substituted alkyl group having 1 to 18 carbon atoms, $R^3$ represents a substituted aryl group, $R^4$, $R^5$, $R^6$ and $R^7$ independently represent a hydrogen atom, an alkyl group having 1 to 10 carbon atoms or a substituted alkyl group having 1 to 10 carbon atoms and may represent a plurality of atoms required for $R^4$ and $R^5$ or $R^6$ and $R^7$ to be combined with each other to form an aliphatic 5- or 6-membered ring, an aromatic 6-membered ring, an aromatic 10-membered ring, a substituted aromatic 6-membered ring or a substituted aromatic 10-membered ring, $R^8$ and $R^9$ independently represent an alkyl group having 1 to 18 carbon atoms, a substituted alkyl group having 1 to 18 carbon atoms, an aryl group having 6 to 18 carbon atoms or a substituted aryl group having 6 to 18 carbon atoms, $R^{10}$ represents an alkyl group having 1 to 18 carbon atoms, a substituted alkyl group having 1 to 18 carbon atoms, an aryl group having 6 to 18 carbon atoms or a substituted aryl group having 6 to 18 carbon atoms and Q represents a counter ion having a molecular weight of 70 or more.

10. A photosensitive composition comprising:

(a) an infrared absorbing agent represented by the following formula (II); and (b) a polymer compound which is insoluble in water and soluble in an aqueous alkali solution, wherein;

the solubility of the photosensitive composition in an aqueous alkali solution is changed by radiation of an infrared laser;

(II)

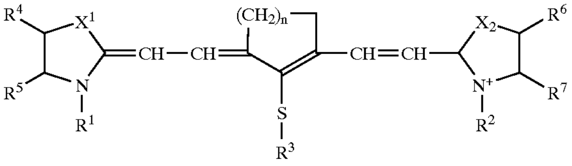

wherein $X^1$ and $X^2$ independently represent —$CR^8R^9$—, —S—, —Se—, —$NR^{10}$—, —CH═CH— or —O—, n denotes an integer of 2, 3 or 4, $R^1$ and $R^2$ independently represent an alkyl group having 1 to 18 carbon atoms or a substituted alkyl group having 1 to 18 carbon atoms, $R^3$ represents a heterocyclic group having 5 to 6 carbon atoms in the ring, $R^4$, $R^5$, $R^6$ and $R^7$ independently represent a hydrogen atom, an alkyl group having 1 to 10 carbon atoms or a substituted alkyl group having 1 to 10 carbon atoms and may represent a plurality of atoms required for $R^4$ and $R^5$ or $R^6$ and $R^7$ to be combined with each other to form an aliphatic 5- or 6-membered ring, an aromatic 6-membered ring, an aromatic 10-membered ring, a substituted aromatic 6-membered ring or a substituted aromatic 10-membered ring, $R^8$ and $R^9$ independently represent an alkyl group having 1 to 18 carbon atoms, a substituted alkyl group having 1 to 18 carbon atoms, an aryl group having 6 to 18 carbon atoms or a substituted aryl group having 6 to 18 carbon atoms, $R^{10}$ represents an alkyl group having 1 to 18 carbon atoms, a substituted alkyl group having 1 to 18 carbon atoms, an aryl group having 6 to 18 carbon atoms or a substituted aryl group having 6 to 18 carbon atoms and Q represents a counter ion having a molecular weight of 70 or more.

11. A photosensitive composition comprising:

(a) an infrared absorbing agent represented by the following formula (II); and (b) a polymer compound which is insoluble in water and soluble in an aqueous alkali solution, wherein;

the solubility of the photosensitive composition in an aqueous alkali solution is changed by radiation of an infrared laser;

(II)

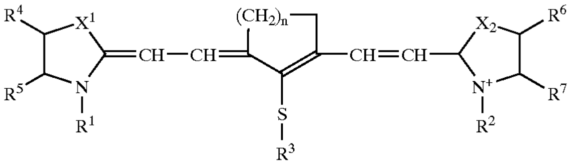

wherein $X^1$ and $X^2$ independently represent —$CR^8R^9$—, —S—, —Se—, —$NR^{10}$—, —CH═CH— or —O—, n denotes an integer of 2, 3 or 4, $R^1$ and $R^2$ independently represent an alkyl group having 1 to 18 carbon atoms or a substituted alkyl group having 1 to 18 carbon atoms, $R^3$ represents a group selected from the group consisting of an alkyl group having 1 to 10 carbon atoms and a substituted alkyl group having 1 to 10 carbon atoms, $R^4$, $R^5$, $R^6$ and $R^7$ independently represent a hydrogen atom, an alkyl group having 1 to 10 carbon atoms or a substituted alkyl group having 1 to 10 carbon atoms and may represent a plurality of atoms required for $R^4$ and $R^5$ or $R^6$ and $R^7$ to be combined with each other to form an aliphatic 5- or 6-membered ring, an aromatic 6-membered ring, an aromatic 10-membered ring, a substituted aromatic 6-membered ring or a substituted aromatic 10-membered ring, $R^8$ and $R^9$ independently represent an alkyl group having 1 to 18 carbon atoms, a substituted alkyl group having 1 to 18 carbon atoms, an aryl group having 6 to 18 carbon atoms or a substituted aryl group having 6 to 18 carbon atoms, $R^{10}$ represents an alkyl group having 1 to 18 carbon atoms, a substituted alkyl group having 1 to 18 carbon atoms, an aryl group having 6 to 18 carbon atoms or a substituted aryl group having 6 to 18 carbon atoms and Q represents a counter ion having a molecular weight of 70 or more.

* * * * *